(12) United States Patent
Komatsu et al.

(10) Patent No.: US 8,778,745 B2
(45) Date of Patent: Jul. 15, 2014

(54) METHOD FOR MANUFACTURING SEMICONDUCTOR DEVICE

(75) Inventors: Ryu Komatsu, Isehara (JP); Yasuhiro Jinbo, Atsugi (JP); Hidekazu Miyairi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 365 days.

(21) Appl. No.: 13/159,830

(22) Filed: Jun. 14, 2011

(65) Prior Publication Data

US 2011/0318888 A1    Dec. 29, 2011

(30) Foreign Application Priority Data

Jun. 29, 2010   (JP) .................................. 2010-148074

(51) Int. Cl.
| | | |
|---|---|---|
| *H01L 21/00* | (2006.01) | |
| *H01L 21/84* | (2006.01) | |
| *H01L 21/20* | (2006.01) | |
| *H01L 21/36* | (2006.01) | |

(52) U.S. Cl.
USPC ........... 438/157; 438/158; 438/478; 438/479; 438/488; 257/E21.09; 257/E21.411

(58) Field of Classification Search
USPC ......................... 438/157–158, 478–479, 488; 257/E21.09, E21.411
See application file for complete search history.

(56) References Cited

U.S. PATENT DOCUMENTS

| | | |
|---|---|---|
| 4,409,134 A | 10/1983 | Yamazaki |
| 5,453,858 A | 9/1995 | Yamazaki |
| 5,514,879 A | 5/1996 | Yamazaki |
| 5,571,578 A | 11/1996 | Kaji et al. |
| 5,582,880 A | 12/1996 | Mochizuki et al. |
| 5,591,987 A | 1/1997 | Yamazaki et al. |
| 5,614,732 A | 3/1997 | Yamazaki |
| 5,648,293 A | 7/1997 | Hayama et al. |

(Continued)

FOREIGN PATENT DOCUMENTS

| | | |
|---|---|---|
| EP | 0535979 A | 4/1993 |
| JP | 04-242724 A | 8/1992 |

(Continued)

OTHER PUBLICATIONS

Arai.T et al., "41.2: Micro Silicon Technology for Active Matrix OLED Display,", SID Digest '07 : SID International Symposium Digest of Technical Papers, 2007, vol. 38, pp. 1370-1373.

(Continued)

*Primary Examiner* — Mohsen Ahmadi
(74) *Attorney, Agent, or Firm* — Eric J. Robinson; Robinson Intellectual Property Law Office, P.C.

(57) ABSTRACT

A method for manufacturing a semiconductor device comprises the steps of forming a seed over the insulating film by introducing hydrogen and a deposition gas into a first treatment chamber under a first condition and forming a microcrystalline semiconductor film over the seed by introducing hydrogen and the deposition gas into a second treatment chamber under a second condition: a second flow rate of the deposition gas is periodically changed between a first value and a second value; and a second pressure in the second treatment chamber is higher than or equal to $1.0 \times 10^2$ Torr and lower than or equal to $1.0 \times 10^3$ Torr.

26 Claims, 17 Drawing Sheets

(56) References Cited

U.S. PATENT DOCUMENTS

| | | | |
|---|---|---|---|
| 5,677,236 | A | 10/1997 | Saitoh et al. |
| 5,701,167 | A | 12/1997 | Yamazaki |
| 5,849,601 | A | 12/1998 | Yamazaki |
| 5,859,445 | A | 1/1999 | Yamazaki |
| 6,011,277 | A | 1/2000 | Yamazaki |
| 6,023,075 | A | 2/2000 | Yamazaki |
| 6,153,893 | A | 11/2000 | Inoue et al. |
| 6,252,249 | B1 | 6/2001 | Yamazaki |
| 6,265,288 | B1 | 7/2001 | Okamoto et al. |
| 6,271,055 | B1 | 8/2001 | Yajima et al. |
| 6,281,520 | B1 | 8/2001 | Yamazaki |
| 6,306,213 | B1 | 10/2001 | Yamazaki |
| 6,344,420 | B1 | 2/2002 | Miyajima et al. |
| 6,468,839 | B2 | 10/2002 | Inoue et al. |
| 6,737,676 | B2 | 5/2004 | Yamazaki |
| 6,855,621 | B2 | 2/2005 | Kondo et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,551,655 | B2 | 6/2009 | Tanaka et al. |
| 7,576,360 | B2 | 8/2009 | Yamazaki |
| 7,833,845 | B2 | 11/2010 | Yamazaki et al. |
| 2009/0002591 | A1 | 1/2009 | Yamazaki et al. |
| 2009/0033818 | A1 | 2/2009 | Nakajima et al. |
| 2009/0047759 | A1 | 2/2009 | Yamazaki et al. |
| 2009/0057683 | A1 | 3/2009 | Nakajima et al. |
| 2009/0061574 | A1 | 3/2009 | Nakajima et al. |
| 2009/0072237 | A1 | 3/2009 | Yamazaki et al. |
| 2010/0216285 | A1 | 8/2010 | Yokoi et al. |
| 2011/0020989 | A1 | 1/2011 | Tajima et al. |
| 2011/0039402 | A1 | 2/2011 | Yamazaki et al. |
| 2011/0053358 | A1* | 3/2011 | Toriumi et al. ............... 438/488 |
| 2011/0059562 | A1 | 3/2011 | Yamazaki et al. |
| 2011/0278582 | A1 | 11/2011 | Tezuka et al. |
| 2012/0021570 | A1 | 1/2012 | Tajima et al. |
| 2012/0052637 | A1 | 3/2012 | Komatsu et al. |
| 2012/0100675 | A1 | 4/2012 | Komatsu et al. |
| 2012/0115285 | A1 | 5/2012 | Komatsu et al. |

FOREIGN PATENT DOCUMENTS

| | | |
|---|---|---|
| JP | 05-129608 A | 5/1993 |
| JP | 05-275346 A | 10/1993 |
| JP | 06-077483 A | 3/1994 |
| JP | 07-045833 A | 2/1995 |
| JP | 07-131030 A | 5/1995 |
| JP | 07-162003 A | 6/1995 |
| JP | 07-211708 A | 8/1995 |
| JP | 09-232235 A | 9/1997 |
| JP | 2000-174310 A | 6/2000 |
| JP | 2000-269201 A | 9/2000 |
| JP | 2000-277439 A | 10/2000 |
| JP | 2001-053283 A | 2/2001 |
| JP | 3201492 | 8/2001 |
| JP | 2002-206168 A | 7/2002 |
| JP | 2002-246605 A | 8/2002 |
| JP | 2002-280309 A | 9/2002 |
| JP | 2003-037278 A | 2/2003 |
| JP | 2004-200345 A | 7/2004 |
| JP | 2005-049832 A | 2/2005 |
| JP | 2005-167264 A | 6/2005 |
| JP | 2005-191546 A | 7/2005 |
| JP | 2006-237490 A | 9/2006 |
| JP | 2009-044134 A | 2/2009 |
| JP | 2009-076753 A | 4/2009 |
| JP | 2009-088501 A | 4/2009 |
| WO | WO 2011/142443 | 11/2011 |

OTHER PUBLICATIONS

Lee.C et al., "How to Achieve High Mobility Thin Film Transistors by Direct Deposition of Silicon Using 13.56 MHz RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities,", Appl. Phys. Lett. (Applied Phyics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Stress Measurements,", Appl. Phys. Lett. (Applied Physics Letters), Sep. 12, 2007, vol. 91, No. 11, pp. 113511-1-113511-3

Lee.C et al., "Stability of NC-Si:H TFTs With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Postdeposition Thermal Annealing and Material Stability of 75° C. Hydrogenated Nanocrystalline Silicon Plasma-Enhanced Chemical Vapor Deposition Films,", J. Appl. Phys. (Journal of Applied Physics), Aug. 4, 2005, vol. 98, No. 3, pp. 034305-1034305-7.

* cited by examiner

200nm

200nm

METHOD FOR MANUFACTURING SEMICONDUCTOR DEVICE

BACKGROUND OF THE INVENTION

1. Field of the Invention

The present invention relates to a method for forming a microcrystalline semiconductor film, a method for manufacturing a semiconductor device including the microcrystalline semiconductor film, and a display device.

In this specification, a semiconductor device means all types of devices which can function by utilizing semiconductor characteristics, and a display device, an electro-optical device, a photoelectric conversion device, a semiconductor circuit, and an electronic device are all semiconductor devices.

2. Description of the Related Art

As one type of field-effect transistor, a thin film transistor whose channel region is formed using a semiconductor film which is formed over a substrate having an insulating surface is known. Techniques in which amorphous silicon, microcrystalline silicon, or polycrystalline silicon is used for the semiconductor film which is used for the channel region of the thin film transistor have been disclosed (see Patent Documents 1 to 5). A typical application of the thin film transistor is a liquid crystal television device, in which the thin film transistor is practically used as a switching transistor in each pixel in a display screen.

A photoelectric conversion device has been developed in which microcrystalline silicon as crystalline silicon that can be formed by a plasma CVD method is used for a semiconductor film having a function of photoelectric conversion (for example, see Patent Document 6).

REFERENCE

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546
[Patent Document 6] Japanese Published Patent Application No. 2000-277439

A thin film transistor whose channel region is formed using an amorphous silicon film has problems of low field-effect mobility and low on-state current. On the other hand, a thin film transistor whose channel region is formed using a microcrystalline silicon film has a problem in that, though the field-effect mobility is improved, the off-state current is higher than that of the thin film transistor whose channel region is formed using an amorphous silicon film and thus sufficient switching characteristics cannot be obtained.

A thin film transistor whose channel region is formed using a polycrystalline silicon film features in that the field-effect mobility is far higher and the on-state current is higher than those of the above-described two kinds of thin film transistors. These features enable this kind of thin film transistor to be used not only as a switching transistor in a pixel but also as an element of a driver circuit that needs to drive at high speed.

However, a manufacturing process of the thin film transistor whose channel region is formed using a polycrystalline silicon film involves a crystallization step for a semiconductor film and has a problem of higher manufacturing costs, as compared to a manufacturing process of the thin film transistor whose channel region is formed using an amorphous silicon film. For example, a laser annealing technique necessary in the process for forming a polycrystalline silicon film has a problem in that large-screen liquid crystal panels cannot be produced efficiently because the laser irradiation area is small.

The size of a glass substrate for manufacturing display panels has grown in the following ascending order: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). The increase in size of the glass substrate is based on the concept of minimum cost design.

However, a technique with which a thin film transistor capable of high-speed operation can be manufactured with high productivity over a large-sized mother glass substrate such as the 10th generation (2950 mm×3400 mm) mother glass substrate has not been established yet, which is a problem in industry.

SUMMARY OF THE INVENTION

An object of one embodiment of the present invention is to provide a method for manufacturing a semiconductor device which has favorable electrical characteristics with high productivity.

According to one embodiment of the present invention, a seed including mixed phase grains having high crystallinity is formed with low grain density under a first condition, and then a microcrystalline semiconductor film is formed under a second condition which allows the mixed phase grains to grow so that a space between the mixed phase grains is filled.

The first condition which allows the grain density of the mixed phase grains with high crystallinity to be low is a condition that the flow rate of hydrogen is greater than or equal to 50 times and less than or equal to 1000 times that of a deposition gas containing silicon or germanium so that the deposition gas is diluted, and that the pressure in a treatment chamber is higher than or equal to 67 Pa and lower than or equal to 1333 Pa. The second condition which allows the mixed phase grains to grow so that the space between the mixed phase grains to be filled is a condition that hydrogen and the deposition gas containing silicon or germanium are introduced into the treatment chamber with the flow ratio of hydrogen to the deposition gas containing silicon or germanium periodically changed, and that the pressure in the treatment chamber is higher than or equal to 1333 Pa and lower than or equal to 13332 Pa.

One embodiment of the present invention is a method for forming a microcrystalline semiconductor film, including the steps of forming a seed which includes mixed phase grains including an amorphous silicon region and a crystallite that is regarded as a single crystal by a plasma CVD method under a first condition; and forming a microcrystalline semiconductor film over the seed by a plasma CVD method under a second condition. The first condition is a condition that a gas containing hydrogen and a deposition gas containing silicon or germanium is used as a source gas introduced into a treatment chamber, that the flow rate of hydrogen is greater than or equal to 50 times and less than or equal to 1000 times that of the deposition gas so that the deposition gas is diluted, and that the pressure in the treatment chamber is higher than or equal to 67 Pa and lower than or equal to 1333 Pa. The second condition is a condition that hydrogen and the deposition gas containing silicon or germanium are introduced into the treatment chamber with the flow ratio of hydrogen to the deposition gas containing silicon or germanium periodically changed, and that the pressure in the treatment chamber is higher than or equal to 1333 Pa and lower than or equal to 13332 Pa.

In the above second condition, periodically changing the flow ratio of hydrogen to the deposition gas containing silicon or germanium means periodically changing the flow rate of hydrogen or periodically changing the flow rate of the deposition gas containing silicon or germanium. When the flow ratio of hydrogen to the deposition gas containing silicon or germanium is low, crystal growth of a microcrystalline semiconductor is preferentially performed. When the flow ratio of hydrogen to the deposition gas containing silicon or germanium is high, etching of an amorphous semiconductor is preferentially performed. When the flow ratio of hydrogen to the deposition gas containing silicon or germanium is low, for example, when the flow rate of hydrogen is greater than or equal to 100 times and less than or equal to 2000 times that of the deposition gas, the crystal growth of the microcrystalline semiconductor can be preferentially performed.

Note that the seed includes, in its category, the one in which the mixed phase grains are dispersed and the one in which the mixed phase grain is continuous (that is, the seed has a film shape). It is preferable to determine the power for generating plasma as appropriate depending on the flow ratio of hydrogen to the deposition gas containing silicon or germanium.

In one embodiment of the present invention, after the microcrystalline semiconductor film is formed under the second condition, a second microcrystalline semiconductor film may be formed over the microcrystalline semiconductor film by a plasma CVD method under a third condition. The third condition is a condition that a gas containing hydrogen and the deposition gas containing silicon or germanium is used as a source gas introduced into the treatment chamber, that the flow ratio of hydrogen to the deposition gas is higher than that in the second condition so that the deposition gas is diluted, and that the pressure in the treatment chamber is higher than or equal to 1333 Pa and lower than or equal to 13332 Pa.

Further, in one embodiment of the present invention, a rare gas can be added to the source gas used in at least one of the first condition, the second condition, and the third condition.

According to one embodiment of the present invention, a seed including mixed phase grains having high crystallinity is formed with low grain density over an insulating film by a plasma CVD method under a first condition, and then a microcrystalline semiconductor film is formed by a plasma CVD method under a second condition which allows crystals of the mixed phase grains to grow so that a space in the seed is filled.

Another embodiment of the present invention is a method for manufacturing a semiconductor device including a thin film transistor whose channel region is formed using the seed and the microcrystalline semiconductor film.

Another embodiment of the present invention is a method for manufacturing a photoelectric conversion device in which the seed and the microcrystalline semiconductor film are used as at least one of a semiconductor film having p-type conductivity, a semiconductor film having n-type conductivity, and a semiconductor film having a function of photoelectric conversion.

According to one embodiment of the present invention, a microcrystalline semiconductor film having high crystallinity can be formed. Further, a semiconductor device having favorable electrical characteristics can be manufactured with high productivity.

DETAILED DESCRIPTION OF THE INVENTION

Figure 1A:
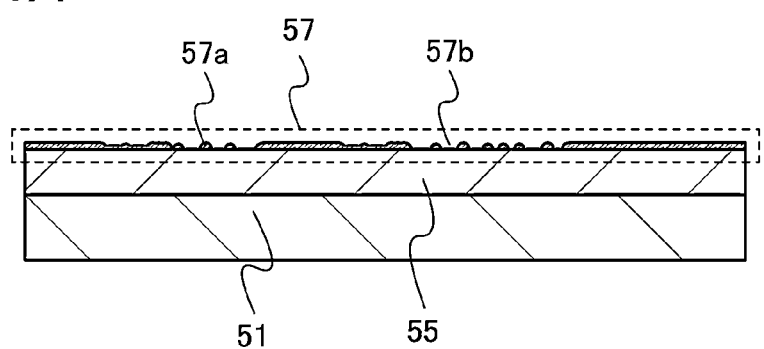
FIGS. 1A and 1B are cross-sectional views illustrating a method for forming a microcrystalline semiconductor film, according to one embodiment of the present invention.

Hereinafter, embodiments and examples of the present invention will be described with reference to the drawings. Note that the present invention is not limited to the following description. The present invention can be implemented in various different ways and it will be readily appreciated by those skilled in the art that various changes and modifications are possible without departing from the spirit and the scope of the present invention. Therefore, the present invention should not be construed as being limited to the following description of the embodiments and examples. Note that reference numerals denoting the same portions are commonly used in different drawings.

Embodiment 1

In this embodiment, a method for forming a microcrystalline semiconductor film having high density and high crystallinity will be described with reference to FIGS. 1A and 1B and FIG. 2.

As illustrated in FIG. 1A, an insulating film 55 is formed over a substrate 51, and a seed 57 is formed over the insulating film 55.

As the substrate 51, a glass substrate, a ceramic substrate, a plastic substrate which has high heat resistance enough to withstand a process temperature of this manufacturing process, or the like can be used. In the case where the substrate does not need a light-transmitting property, a metal substrate, such as a stainless steel substrate, provided with an insulating film on its surface may be used. As the glass substrate, for example, an alkali-free glass substrate of barium borosilicate glass, aluminoborosilicate glass, aluminosilicate glass, or the like may be used. Note that there is no limitation on the size of the substrate 51. For example, any of glass substrates of the 3rd to 10th generations which are often used in the field of the above flat panel displays can be used.

The insulating film 55 can be formed as a single layer or a stacked layer using a silicon oxide film, a silicon oxynitride film, a silicon nitride film, a silicon nitride oxide film, an aluminum oxide film, an aluminum nitride film, an aluminum oxynitride film, or an aluminum nitride oxide film by a CVD method, a sputtering method, or the like.

Note that here, silicon oxynitride means silicon that contains more oxygen than nitrogen. In the case where measurements are performed using Rutherford backscattering spectrometry (RBS) and hydrogen forward scattering spectrometry (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide means silicon that contains more nitrogen than oxygen. In the case where measurements are performed using RBS and HFS, silicon nitride oxide preferably contains nitrogen, oxygen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The seed 57 is formed using a microcrystalline semiconductor film typified by a microcrystalline silicon film, a microcrystalline silicon germanium film, a microcrystalline germanium film, or the like. The seed 57 includes, in its category, the one in which a plurality of mixed phase grains is dispersed, the one having a film shape in which a mixed phase grain is continuous, and the one having a film shape in which a mixed phase grain and an amorphous semiconductor are each continuous. Therefore, the seed 57 may have a space 57b between adjacent mixed phase grains 57a without the mixed phase grains 57a and/or the amorphous semiconductors being in contact with each other. Further, the seed 57 includes the mixed phase grains having high crystallinity with low grain density (corresponding to the existing percentage of the mixed phase grains in a seed). Note that the mixed phase grains include an amorphous semiconductor region and crystallites regarded as single crystals. In some cases, the mixed phase grains may include a twin crystal.

The seed 57 is formed in a treatment chamber of a plasma CVD apparatus by glow discharge plasma with the use of a mixture of hydrogen and a deposition gas containing silicon or germanium, under a first condition which allows the mixed phase grains having high crystallinity to be formed with low grain density in the seed. Alternatively, the seed 57 is formed by glow discharge plasma with the use of a mixture of hydrogen, a deposition gas containing silicon or germanium, and a rare gas such as helium, argon, neon, krypton, or xenon. Here, microcrystalline silicon, microcrystalline silicon germanium, microcrystalline germanium, or the like is formed under the first condition that the flow rate of hydrogen is greater than or equal to 50 times and less than or equal to 1000 times that of the deposition gas containing silicon or germanium so that the deposition gas is diluted, and that the pressure in the treatment chamber is higher than or equal to 67 Pa and lower than or equal to 1333 Pa (higher than or equal to 0.5 Torr and lower than or equal to 10 Torr). The deposition temperature at this time is preferably room temperature to 300° C., more preferably 150° C. to 280° C. The distance between an upper electrode and a lower electrode is set to a distance which allows generation of plasma. With the first condition, crystal growth is promoted and the crystallinity of the mixed phase grains 57a in the seed 57 is improved. That is, the size of the crystallites included in the mixed phase grains 57a in the seed 57 is increased. Further, the space 57b is formed between the adjacent mixed phase grains 57a. Accordingly, the grain density of the mixed phase grains 57a is lowered.

Typical examples of the deposition gas containing silicon or germanium include $SiH_4$, $Si_2H_6$, $GeH_4$, $Ge_2H_6$, and the like.

When a rare gas such as helium, neon, argon, krypton, or xenon is added to a source gas of the seed 57, the deposition rate of the seed 57 can be increased. Thus, the deposition rate is increased, so that the amount of impurities mixed in the seed 57 can be reduced. Accordingly, the crystallinity of the seed 57 can be increased. With the use of a rare gas such as helium, argon, neon, krypton, or xenon as the source gas of the seed 57, stable plasma can be generated without applying high power. Therefore, plasma damage to the seed 57 can be reduced and the crystallinity of the mixed phase grains 57a can be increased.

When the seed 57 is formed, glow discharge plasma is generated by application of high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. Alternatively, glow discharge plasma is generated by application of high-frequency power with a microwave of 1 GHz or higher. Note that pulsed oscillation by which high-frequency power is applied in a pulsed manner or continuous oscillation by which high-frequency power is applied continuously can be employed. In addition, by superimposing high-frequency power in the HF band and high-frequency power in the VHF band on each other, unevenness of plasma in a large-sized substrate is also reduced, so that uniformity can be improved and the deposition rate can be increased.

The flow rate of hydrogen is set higher than that of the deposition gas containing silicon or germanium as described above, whereby the amorphous semiconductor contained in the seed 57 is etched while the seed 57 is deposited, so that the mixed phase grains 57a having high crystallinity are formed and the space 57b is formed between the adjacent mixed phase grains 57a. Optimal conditions differ depending on an apparatus structure and chemical states of a surface on which a film is to be formed; however, when the mixed phase grains 57a are hardly deposited, the flow rate of hydrogen may be set lower than that of the deposition gas containing silicon or germanium or the RF electric power may be reduced. On the other hand, when the grain density of the mixed phase grains 57a is high or the proportion of the amorphous semiconductor region is higher than that of a crystalline semiconductor region, the flow rate of hydrogen may be set higher than that of the deposition gas containing silicon or germanium or the RF electric power may be increased. The state of deposition of the seed 57 can be evaluated by SEM (scanning electron microscopy) and Raman spectroscopy. By employing the above flow ratio and pressure condition of the treatment chamber, the seed 57 can have favorable crystallinity and have a preferable space between the mixed phase grains. Thus, the mixed phase grains 57a are formed while the amorphous semiconductor region in the seed 57 is etched. Accordingly, crystal growth is promoted and the crystallinity of the mixed phase grains 57a is improved. That is, the size of the crystallites included in the mixed phase grains 57a is increased. Further, since the amorphous semiconductor region between the adjacent mixed phase grains 57a is etched, the space 57b is formed between the adjacent mixed phase grains 57a. Accordingly, the mixed phase grains 57a are formed with low grain density. Note that when the seed 57 is formed under the first condition of this embodiment, variation in grain size of the mixed phase grains is caused in some cases.

Note that before the seed 57 is formed, a deposition gas containing silicon or germanium is introduced into the treatment chamber while a gas in the treatment chamber of the CVD apparatus is removed so that impurity elements in the treatment chamber are removed. Thus, the amount of the impurity elements in the seed 57 can be reduced. Further, the seed 57 can be formed to be dense in such a manner that, before the seed 57 is formed, plasma is generated in an atmosphere containing fluorine such as a fluorine atmosphere, a nitrogen fluoride atmosphere, or a silane fluoride atmosphere, and then the insulating film 55 is exposed to the fluorine plasma.

Figure 1B:
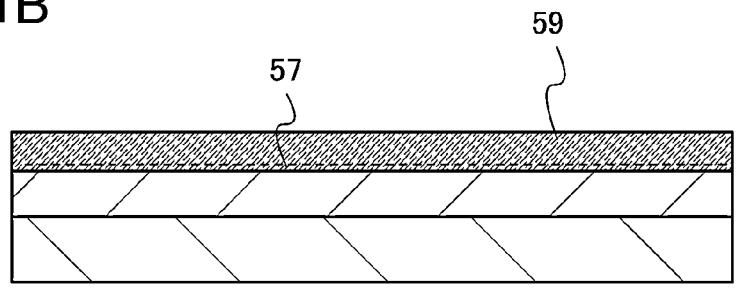

Next, as illustrated in FIG. 1B, a microcrystalline semiconductor film 59 is formed over the seed 57. The microcrystalline semiconductor film 59 is formed under a condition which allows crystals of the seed 57 to grow so that the space between the mixed phase grains is filled. Note that the thickness of the microcrystalline semiconductor film 59 is preferably greater than or equal to 30 nm and less than or equal to 100 nm.

The microcrystalline semiconductor film 59 is formed in the treatment chamber of the plasma CVD apparatus by glow discharge plasma with the use of the mixture of hydrogen and the deposition gas containing silicon or germanium under a second condition. Alternatively, the microcrystalline semiconductor film 59 may be formed by glow discharge plasma with the use of a mixture of a source gas of the second condition and a rare gas such as helium, argon, neon, krypton, or xenon. Here, the second condition is as follows: the flow ratio of hydrogen to the deposition gas containing silicon or germanium is periodically changed, and the pressure in the treatment chamber is higher than or equal to 1333 Pa and lower than or equal to 13332 Pa (higher than or equal to 10 Torr and lower than or equal to 100 Torr).

Periodically changing the flow ratio of hydrogen to the deposition gas containing silicon or germanium means periodically changing the flow rate of hydrogen or periodically changing the flow rate of the deposition gas containing silicon or germanium. In the case where the flow ratio of hydrogen to the deposition gas containing silicon or germanium is low, typically, in the case where the flow rate of hydrogen is greater than or equal to 100 times and less than or equal to 2000 times that of the deposition gas, crystal growth of the microcrystalline semiconductor is preferentially performed. On the other hand, in the case where the flow ratio of hydrogen to the deposition gas containing silicon or germanium is high, the etching of the amorphous semiconductor is preferentially performed.

Microcrystalline silicon, microcrystalline silicon germanium, microcrystalline germanium, or the like is formed under the above second condition. As a result, in the microcrystalline semiconductor film 59, the ratio of the crystal regions to the amorphous semiconductor regions is increased and the space between the crystal regions is reduced, whereby the crystallinity of the microcrystalline semiconductor film 59 is improved. The deposition temperature at this time is preferably room temperature to 300° C., more preferably 150° C. to 280° C. The distance between the upper electrode and the lower electrode is set to a distance which allows generation of plasma.

The condition for generating glow discharge plasma at the time of forming the seed 57 can be employed as appropriate for the microcrystalline semiconductor film 59. In the case where the condition for generating glow discharge plasma at the time of forming the seed 57 and that at the time of forming the microcrystalline semiconductor film 59 are the same, throughput can be increased; however, they may be different from each other.

Here, a method for periodically changing the flow ratio of hydrogen to the deposition gas containing silicon or germanium is described with reference to FIG. 2. FIG. 2 is a timing chart illustrating temporal changes in the source gas and power supplied to an apparatus in the method for forming a microcrystalline semiconductor film, which is described in this embodiment. In FIG. 2, a solid line 71 indicates on/off states of power supply of the plasma CVD apparatus, a solid line 73 indicates the flow rate of hydrogen, a solid line 75 indicates the flow rate of the deposition gas containing silicon or germanium (silane is used in FIG. 2), and a solid line 79 indicates the flow rate of a rare gas (argon is used in FIG. 2).

Hydrogen and the deposition gas containing silicon or germanium, which are the source gas, are introduced into the treatment chamber of the plasma CVD apparatus and the pressure therein is set at a predetermined level. The temperature of the substrate 51 is set at a predetermined temperature. At this time, hydrogen is introduced into the treatment chamber with a fixed flow rate (a flow rate a in FIG. 2).

Next, high-frequency power supply is turned on, and plasma discharge is performed. The deposition gas containing silicon or germanium whose flow rate is periodically changed is introduced into the treatment chamber. Here, periodically changing the flow ratio of hydrogen to the deposition gas containing silicon or germanium is referred to as a cycle flow. In this embodiment, a first cycle in which the deposition gas containing silicon or germanium with a flow rate c is supplied for $t_1$ seconds after the power supply is turned on and a second cycle in which the deposition gas containing silicon or germanium with a flow rate b (b<c) is supplied for $t_2$ seconds after the power supply is turned on are repeated. Note that the flow rate of the deposition gas containing silicon or germanium in the second cycle is lower than that in the first cycle, so that the flow ratio of hydrogen to the deposition gas containing silicon or germanium in the second cycle is higher than that in the first cycle. In the first cycle, in the case where the flow rate of hydrogen is made greater than or equal to 100 times and less than or equal to 2000 times that of the deposition gas, crystal growth of the microcrystalline semiconductor is preferentially performed by plasma discharge performed later. In the second cycle, in the case where the flow rate of hydrogen is made greater than or equal to 100 times and less than or equal to 2000 times that of the deposition gas, etching of the amorphous semiconductor is preferentially performed.

Note that the high-frequency power supply may be turned on and turned off repeatedly as shown by a dotted line 72.

Radicals are generated from the deposition gas containing silicon or germanium along with hydrogen radicals in plasma. When the pressure in the treatment chamber is set higher than or equal to 1333 Pa and lower than or equal to 13332 Pa (higher than or equal to 10 Torr and lower than or equal to 100 Torr), the mean free path of the deposition gas is short because of such high pressure in the treatment chamber; thus, the energy of hydrogen radicals and hydrogen ions is lost every time they collide with each other. Accordingly, the energy of hydrogen radicals and hydrogen ions when they reach the seed 57 is low. Therefore, in a space between the mixed phase grains formed in the seed 57, not the etching but the crystal growth is preferentially promoted; thus, a microcrystalline semiconductor is deposited and the space between the crystal regions is reduced. In such a manner, the density of the microcrystalline semiconductor film is improved. When the pressure in the treatment chamber is set to the above level, the energy thereof becomes low, so that plasma damage to the microcrystalline semiconductor film is reduced. Thus, defects are reduced.

In the second cycle in which the flow rate of the deposition gas containing silicon or germanium is low (the flow rate b in FIG. 2), when the pressure in the treatment chamber is set higher than or equal to 1333 Pa and lower than or equal to 13332 Pa (higher than or equal to 10 Torr and lower than or equal to 100 Torr), the amorphous semiconductor in the seed 57 which is formed under the first condition is selectively etched by hydrogen radicals dissociated in plasma because of such high pressure in the treatment chamber. Note that the radicals (typically, silyl radicals) are slightly generated from the deposition gas containing silicon or germanium, and are bonded to dangling bonds of the microcrystalline semiconductor on the deposition surface; thus, crystals with high crystallinity grow. That is, crystal growth occurs concurrently with the selective etching, whereby the crystallinity of the microcrystalline semiconductor film is improved.

In the first cycle in which the flow rate of the deposition gas containing silicon or germanium is high (the flow rate c in FIG. 2), a large number of radicals are generated from the deposition gas containing silicon or germanium as compared to the second cycle in which the flow rate of the deposition is b, so that the crystal growth occurs. The microcrystalline semiconductor film includes a plurality of the mixed phase grains, and the size of the crystallites in the mixed phase grains can be increased by the method for forming the microcrystalline semiconductor film, which is described in this embodiment; thus, the crystallinity of the microcrystalline semiconductor film can be improved. Further, defects of the microcrystalline semiconductor film 59 are reduced.

When mixed phase grains of the microcrystalline semiconductor film are newly generated in the space between the mixed phase grains of the seed, the size of the mixed phase grains is reduced. Therefore, it is preferable that the frequency of generation of the mixed phase grains of the microcrystalline semiconductor film be lower than that of the mixed phase grains of the seed. Thus, crystal growth from the seed can be preferentially promoted.

Note that here, after the first cycle in which the deposition gas containing silicon or germanium flows with the flow rate c, the second cycle in which the deposition gas containing silicon or germanium flows with the flow rate b follows; however, after the second cycle in which the deposition gas containing silicon or germanium flows with the flow rate b, the first cycle in which the deposition gas containing silicon or germanium flows with the flow rate c may follow. Further, the length of $t_1$ and that of $t_2$ may be the same as or different from each other. Note that $t_1$ and $t_2$ are each preferably several seconds to several tens of seconds. When $t_1$ and $t_2$ are each several minutes, for example, a microcrystalline semiconductor film having low crystallinity with several nanometers thickness is formed in $t_1$, and only a surface of the microcrystalline semiconductor film is reacted in $t_2$. Accordingly, it is difficult to increase the crystallinity inside the microcrystalline semiconductor film.

Note that here, all the first cycles, i.e., all periods during which the deposition gas containing silicon or germanium flows with the flow rate c, take $t_1$ seconds; however, they may take different times. Further, here, all the second cycles, i.e., all periods during which the deposition gas containing silicon or germanium flows with the flow rate b (b<c), take $t_2$ seconds; however, they may take different times.

Figure 2:
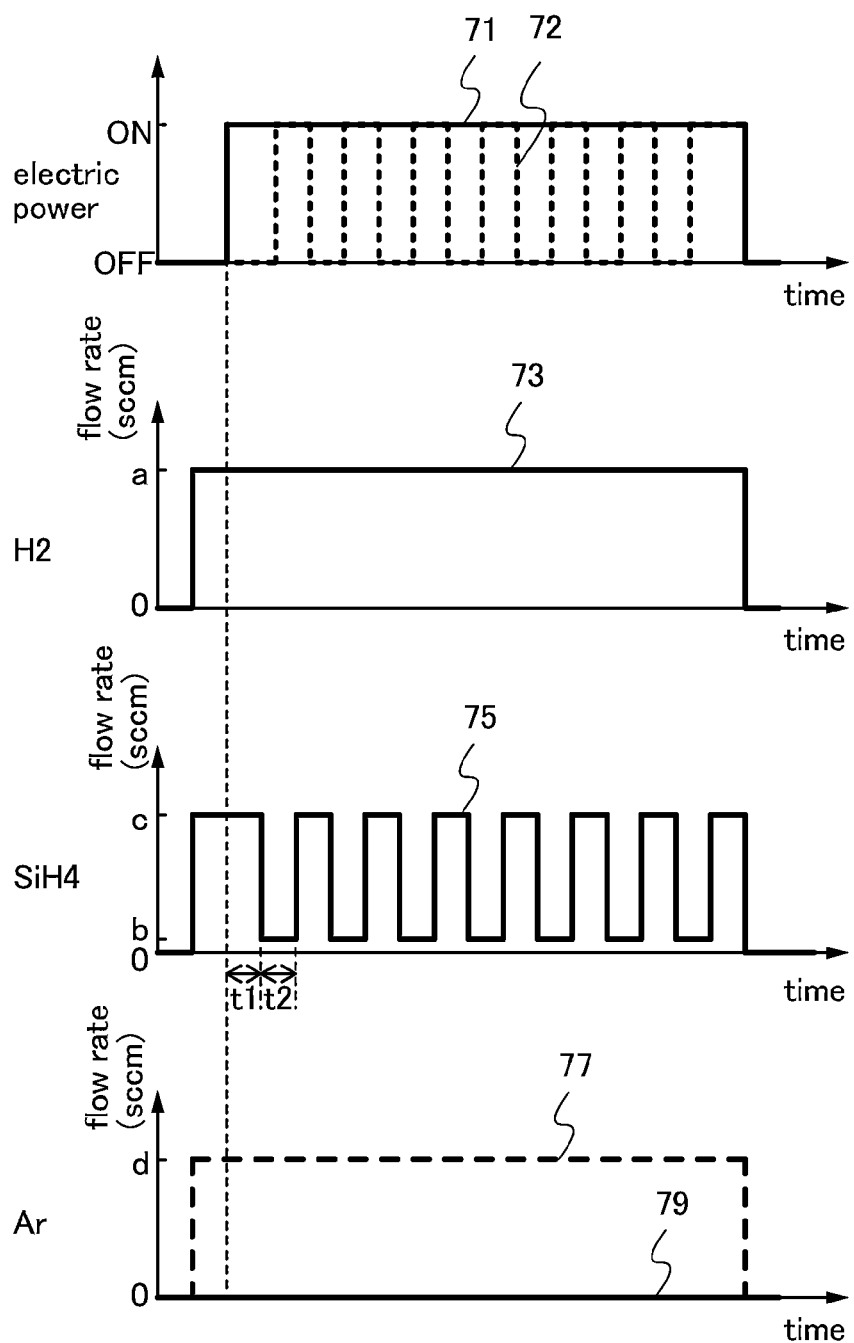
FIG. 2 illustrates a method for forming a microcrystalline semiconductor film, according to one embodiment of the present invention.

Further, as shown by the solid line 79 in FIG. 2, a rare gas such as helium, argon, neon, krypton, or xenon is not introduced into the treatment chamber; however, as shown by a dotted line 77, the rare gas may be introduced into the treatment chamber. Alternatively, a rare gas whose flow rate is periodically changed may be introduced into the treatment chamber.

Note that although the flow rate of hydrogen is fixed here, the flow rate may be changed within the amount range of hydrogen needed for forming the microcrystalline semiconductor. Alternatively, the flow rate of the deposition gas containing silicon or germanium may be fixed and the flow rate of hydrogen may be periodically changed.

Changing the flow rate of the source gas while the high-frequency power supply is kept on can improve the deposition rate of the microcrystalline semiconductor film.

Note that after the deposition gas containing silicon or germanium is introduced into the treatment chamber with the flow rate c, that is, after the first cycle, the high-frequency power supply may be turned off. Alternatively, after the deposition gas containing silicon or germanium is introduced into the treatment chamber with the flow rate b, that is, after the second cycle, the high-frequency power supply may be turned off.

Through the above steps, the microcrystalline semiconductor film having high crystallinity can be formed.

The thickness of the seed 57 is preferably greater than or equal to 1 nm and less than or equal to 10 nm. If the thickness of the seed 57 is greater than 10 nm, even when the microcrystalline semiconductor film 59 is deposited, it is difficult to fill the space between the mixed phase grains and to etch the amorphous semiconductor contained in the seed 57, so that the crystallinity of the seed 57 and the microcrystalline semiconductor film 59 is reduced. In addition, since the mixed phase grain needs to be formed in the seed 57, the thickness of the seed 57 is preferably greater than or equal to 1 nm.

It is preferable that the thickness of the microcrystalline semiconductor film 59 be greater than or equal to 30 nm and less than or equal to 100 nm. The reason for this is as follows: when the microcrystalline semiconductor film 59 has a thickness of 30 nm or more, variation in electrical characteristics of thin film transistors can be reduced; and when the microcrystalline semiconductor film 59 has a thickness of 100 nm or less, throughput can be increased and film peeling due to stress can be suppressed.

The seed 57 and the microcrystalline semiconductor film 59 include a microcrystalline semiconductor. Note that a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and a crystalline semiconductor having short-range order and lattice distortion, in which columnar or needle-like mixed phase grains having a size of 2 nm to 200 nm, preferably 10 nm to 80 nm, more preferably 20 nm to 50 nm have grown in a direction normal to the substrate surface. Therefore, there is a case in which a crystal grain boundary is formed at the interface between the columnar or needle-like mixed phase grains. Note that the size of the mixed phase grain here means a maximum diameter of a mixed phase grain in a plane parallel to the substrate surface.

The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon includes hydrogen or halogen at 1 atomic % or more in order to terminate a dangling bond. Moreover, microcrystalline silicon is made to contain a rare gas element such as helium, argon, neon, krypton, or xenon to further enhance lattice distortion, whereby stability is improved and a favorable microcrystalline semiconductor film can be obtained. Such a microcrystalline semiconductor is disclosed in, for example, U.S. Pat. No. 4,409,134.

According to this embodiment, a microcrystalline semiconductor film having high crystallinity with a space between mixed phase grains reduced can be formed.

Embodiment 2

In this embodiment, a method for forming a microcrystalline semiconductor film having higher crystallinity than the microcrystalline semiconductor film in Embodiment 1 will be described with reference to FIGS. 1A and 1B and FIG. 3.

As in Embodiment 1, the seed 57 and the microcrystalline semiconductor film 59 are formed through the process of FIGS. 1A and 1B.

Figure 3:
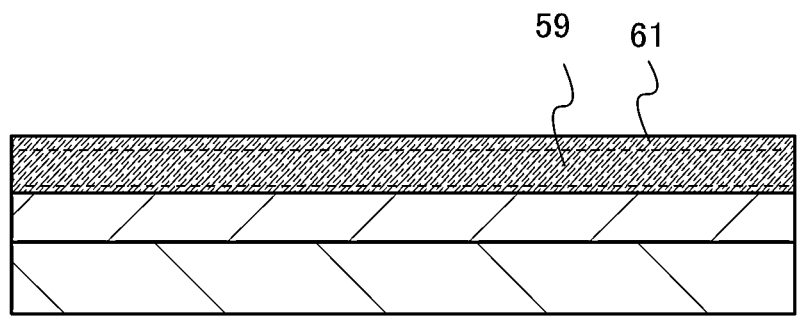
FIG. 3 is a cross-sectional view illustrating a method for forming a microcrystalline semiconductor film, according to one embodiment of the present invention.

Next, as illustrated in FIG. 3, a second microcrystalline silicon film 61 is formed over the microcrystalline silicon film 59.

The second microcrystalline silicon film 61 is formed in a treatment chamber of the plasma CVD apparatus, using glow discharge plasma with the use of a mixture of hydrogen and a deposition gas containing silicon or germanium under a third condition. Alternatively, the second microcrystalline silicon film 61 may be formed using glow discharge plasma with the use of a mixture of hydrogen, a deposition gas containing silicon or germanium, and a rare gas such as helium, argon, neon, krypton, or xenon under the third condition. Here, as the second microcrystalline semiconductor film 61, microcrystalline silicon, microcrystalline silicon germanium, microcrystalline germanium, or the like is formed under the third condition that the flow ratio of hydrogen to the deposition gas containing silicon or germanium is higher than that in the second condition so that the deposition gas is diluted, and that the pressure in the treatment chamber is higher than or equal to 1333 Pa and lower than or equal to 13332 Pa (higher than or equal to 10 Torr and lower than or equal to 100 Torr) similarly to that in the second condition. The deposition temperature at this time is preferably room temperature to 300° C., more preferably 150° C. to 280° C.

Similarly to the second condition, the third condition may be as follows: the flow ratio of hydrogen to the deposition gas containing silicon or germanium is periodically changed, and the pressure in the treatment chamber is higher than or equal to 1333 Pa and lower than or equal to 13332 Pa (higher than or equal to 10 Torr and lower than or equal to 100 Torr). At this time, when the flow ratio of hydrogen to the deposition gas containing silicon or germanium in the third condition is low and that in the second condition is low, that in the third condition is made higher than that in the second condition; thus, the crystallinity of the second microcrystalline semiconductor film 61 can be further improved.

By setting the flow ratio of hydrogen to the deposition gas containing silicon or germanium higher than that in the second condition, the crystallinity of the second microcrystalline semiconductor film 61 can be further improved; in such a manner, a microcrystalline semiconductor film whose surface crystallinity is higher than that of the microcrystalline semiconductor film in Embodiment 1 can be formed.

Embodiment 3

In this embodiment, a method for manufacturing a thin film transistor formed in a semiconductor device that is one embodiment of the present invention will be described with reference to FIGS. 4A to 4D, FIGS. 5A and 5B, FIGS. 6A to 6C, and FIGS. 7A to 7D. Note that an n-channel thin film transistor has higher carrier mobility than a p-channel thin film transistor. Further, it is preferable that all thin film transistors formed over the same substrate have the same polarity because the number of manufacturing steps can be reduced. Therefore, in this embodiment, a method for manufacturing an n-channel thin film transistor will be described.

Note that the term "on-state current" refers to current which flows between a source electrode and a drain electrode when a thin film transistor is on. For example, in the case of an n-channel thin film transistor, the on-state current refers to current which flows between a source electrode and a drain electrode when gate voltage is higher than threshold voltage of the transistor.

In addition, the term "off-state current" refers to current which flows between a source electrode and a drain electrode when a thin film transistor is off. For example, in the case of an n-channel thin film transistor, the off-state current refers to current which flows between a source electrode and a drain electrode when gate voltage is lower than threshold voltage of the thin film transistor.

Figure 4A:
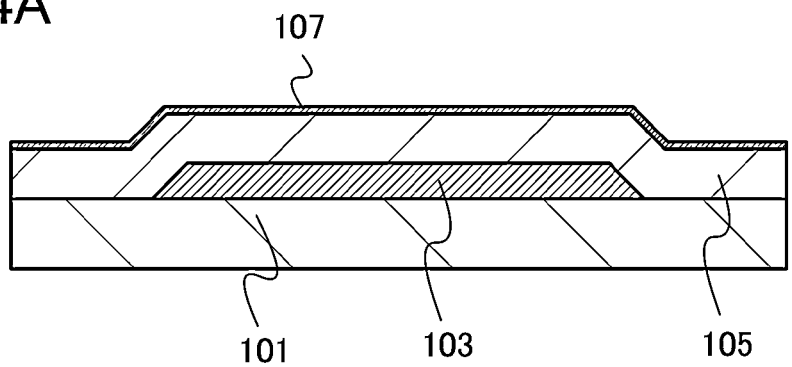
FIGS. 4A to 4D are cross-sectional views illustrating a method for manufacturing a semiconductor device, according to one embodiment of the present invention.

As illustrated in FIG. 4A, a gate electrode 103 is formed over a substrate 101. Then, a gate insulating film 105 which covers the gate electrode 103 (also referred to as a first gate electrode) is formed. A seed 107 is formed over the gate insulating film 105.

As the substrate 101, the substrate 51 described in Embodiment 1 can be used as appropriate.

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. A semiconductor typified by polycrystalline silicon doped with an impurity element such as phosphorus, an Ag—Pd—Cu alloy, an Al—Nd alloy, an Al—Ni alloy, or the like may be used.

For example, the following is preferable as a two-layer structure of the gate electrode 103: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, a two-layer structure in which a titanium nitride film and a molybdenum film are stacked, a two-layer structure in which a film of a copper-magnesium alloy containing oxygen and a copper film are stacked, a two-layer structure in which a film of a copper-manganese alloy containing oxygen and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film functioning as a barrier film over a film having low electric resistance, electric resistance can be low and diffusion of metal elements from the metal film into the semiconductor film can be prevented.

The gate electrode 103 can be formed in the following manner: a conductive film is formed over the substrate 101 by a sputtering method or a vacuum evaporation method using the above-described material(s); a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a nitride film of any of the above-described metal materials may be provided between the substrate 101 and the gate electrode 103. In this embodiment, a conductive film is formed over the substrate 101 and etched using a resist mask formed by a photolithography method.

Note that a side surface of the gate electrode 103 is preferably tapered. This is because an insulating film, a semiconductor film, and a wiring formed over the gate electrode 103 in later steps can be prevented from being cut at a step portion of the gate electrode 103. In order to taper the side surface of the gate electrode 103, etching may be performed while the resist mask is made to recede.

Through the step of forming the gate electrode 103, a gate wiring (a scan line) and a capacitor wiring can also be formed at the same time. The scan line means a wiring for selecting a pixel, while the capacitor wiring means a wiring which is connected to one of electrodes of a storage capacitor in a pixel. However, without limitation thereto, the gate electrode 103 and one of or both a gate wiring and a capacitor wiring may be formed separately.

The gate insulating film 105 can be formed using the insulating film 55 described in Embodiment 1 as appropriate. By forming the gate insulating film 105 using an oxide insulating film such as a silicon oxide film or a silicon oxynitride film, fluctuation in threshold voltage of the thin film transistor can be suppressed.

The gate insulating film 105 can be formed by a CVD method, a sputtering method, or the like. The condition used for the deposition of the seed 57 which is described in Embodiment 1 can be employed as appropriate to generate the glow discharge plasma in the step for the formation of the gate insulating film 105 by a CVD method. When the gate insulating film 105 is formed at a high frequency (1 GHz or more) using a microwave plasma CVD apparatus, the withstand voltage between the gate electrode and the drain and source electrodes can be improved, so that a highly reliable thin film transistor can be obtained.

Further, by forming a silicon oxide film by a CVD method using an organosilane gas as the gate insulating film 105, the crystallinity of the semiconductor film which is formed later can be improved, so that the on-state current and the field-effect mobility of the thin film transistor can be increased. Examples of the organosilane gas include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane ($SiH(N(CH_3)_2)_3$).

Similarly to the seed 57 described in Embodiment 1, the seed 107 can be formed under a first condition which allows mixed phase grains having high crystallinity to be formed with low grain density.

In the case where a rare gas such as helium, argon, neon, krypton, or xenon is added to the source gas of the seed 107, the crystallinity of the seed 107 can be improved. Accordingly, the on-state current and the field-effect mobility of the thin film transistor are increased and the throughput of the thin film transistor can also be increased.

Figure 4B:
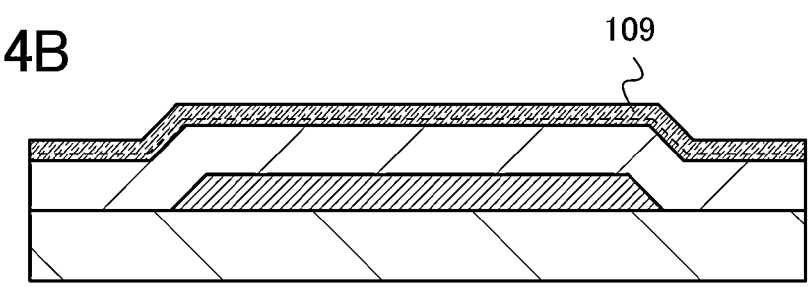

Next, as illustrated in FIG. 4B, a microcrystalline semiconductor film 109 is formed over the seed 107. Similarly to the microcrystalline semiconductor film 59 described in Embodiment 1, the microcrystalline silicon film 109 can be formed under a second condition which allows the mixed phase grains in the seed 107 to grow so that the space between the mixed phase grains is filled.

A rare gas such as helium, argon, neon, krypton, or xenon is added to the source gas of the microcrystalline semiconductor film 109, whereby the crystallinity of the microcrystalline semiconductor film 109 can be improved similarly to that of the seed 107. Accordingly, the on-state current and the field-effect mobility of the thin film transistor are increased and the throughput of the thin film transistor can also be increased.

Figure 4C:
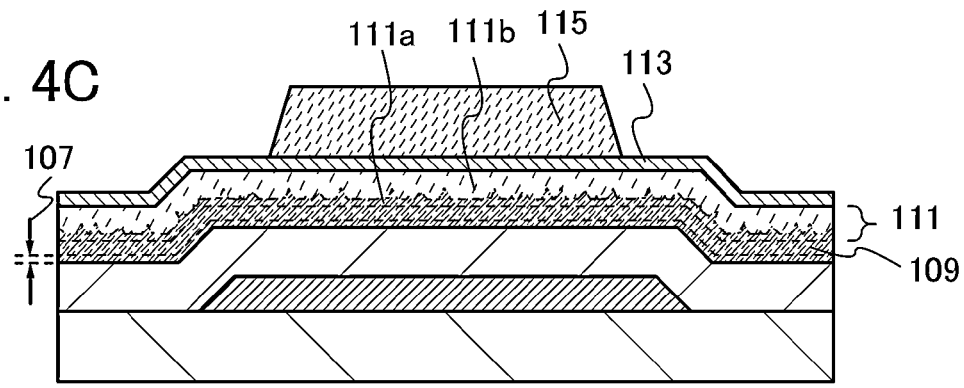
Figure 4D:
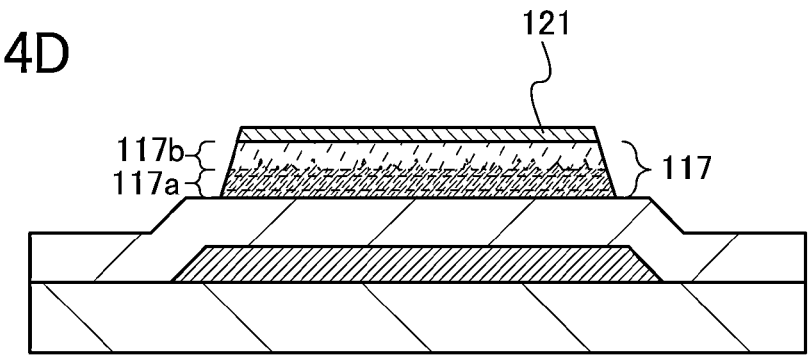

Next, as illustrated in FIG. 4C, a semiconductor film 111 is formed over the microcrystalline semiconductor film 109. The semiconductor film 111 includes a microcrystalline semiconductor region 111a and an amorphous semiconductor region 111b. Next, an impurity semiconductor film 113 is formed over the semiconductor film 111. Then, a resist mask 115 is formed over the impurity semiconductor film 113.

The semiconductor film 111 including the microcrystalline semiconductor region 111a and the amorphous semiconductor region 111b can be formed under a condition which causes partial crystal growth using the microcrystalline semiconductor film 109 as a seed (a condition which allows the crystal growth to be suppressed).

The semiconductor film 111 is formed in the treatment chamber of the plasma CVD apparatus by glow discharge plasma with the use of a mixture of hydrogen, a deposition gas containing silicon or germanium, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the seed 107.

In this case, the flow ratio of hydrogen to the deposition gas containing silicon or germanium is similar to that for forming the seed 107 or the microcrystalline semiconductor film 109, and a gas containing nitrogen is further used for the source gas, whereby crystal growth can be suppressed as compared to the deposition condition of the seed 107 and the microcrystalline semiconductor film 109. Specifically, since a gas containing nitrogen is included in the source gas, the crystal growth is partly reduced at an early stage of deposition of the semiconductor film 111; therefore, a conical or pyramidal microcrystalline semiconductor region grows, and an amorphous semiconductor region is formed. Furthermore, at a middle stage or later stage of deposition, the crystal growth of the conical or pyramidal microcrystalline semiconductor region is stopped, and only the amorphous semiconductor region is deposited. As a result, in the semiconductor film 111, the microcrystalline semiconductor region 111a and the amorphous semiconductor region 111b which is formed using a well-ordered semiconductor film having fewer defects and a steep tail of a level at a band edge in the valence band, can be formed.

Here, a typical example of a condition for forming the semiconductor film 111 is as follows. The flow rate of hydrogen is 10 times to 2000 times, preferably 10 times to 200 times that of the deposition gas containing silicon or germanium. Note that in a typical example of a normal condition for forming an amorphous semiconductor layer, the flow rate of hydrogen is 0 times to 5 times that of the deposition gas containing silicon or germanium.

A rare gas such as helium, argon, neon, xenon, or krypton is introduced into the source gas of the semiconductor film 111, whereby the deposition rate can be increased.

The thickness of the semiconductor film 111 is preferably 50 nm to 350 nm, more preferably 120 nm to 250 nm.

Figure 5A:
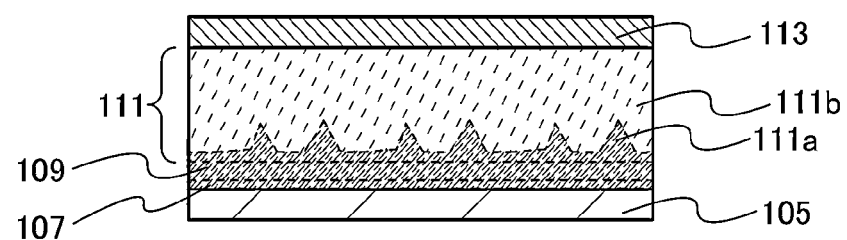
FIGS. 5A and 5B are cross-sectional views each illustrating a method for manufacturing a semiconductor device, according to one embodiment of the present invention.
Figure 5B:
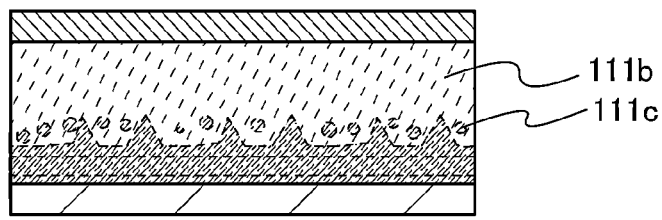

FIGS. 5A and 5B are enlarged views of the portion between the gate insulating film 105 and the impurity semiconductor film 113 illustrated in FIG. 4C.

As illustrated in FIG. 5A, the microcrystalline semiconductor region 111a in the semiconductor film 111 has a projection and a depression; and the projection has a conical or pyramidal shape whose width decreases from the gate insulating film 105 side toward the amorphous semiconductor region 111b side (a tip of the projection has an acute angle). Alternatively, the microcrystalline semiconductor region 111a may have a projection (inverted conical or pyramidal shape) whose width increases from the gate insulating film 105 toward the amorphous semiconductor region 111b.

By setting the thickness of the seed 107, the microcrystalline semiconductor film 109, and the microcrystalline semiconductor region 111a, that is, the distance from the interface between the gate insulating film 105 and the seed 107 to the tip of the projection of the microcrystalline semiconductor region 111a to 5 nm to 310 nm, the off-state current of the thin film transistor can be reduced.

Further, in order to improve the crystallinity of the microcrystalline semiconductor region 111a, it is preferable that the oxygen concentration in the semiconductor film 111, which is measured by secondary ion mass spectrometry, be less than $1 \times 10^{18}$ atoms/cm$^3$. The nitrogen concentration profile of the semiconductor film 111, which is measured by secondary ion mass spectrometry, has a peak concentration within the range of $1 \times 10^{20}$ atoms/cm$^3$ to $1 \times 10^{21}$ atoms/cm$^3$, preferably $2 \times 10^{20}$ atoms/cm$^3$ to $1 \times 10^{21}$ atoms/cm$^3$.

The amorphous semiconductor region 111b is formed using an amorphous semiconductor containing nitrogen. Nitrogen of the amorphous semiconductor containing nitrogen may exist, for example, as an NH group or an NH$_2$ group. The amorphous semiconductor is formed using amorphous silicon.

The amorphous semiconductor containing nitrogen is a semiconductor having lower energy at an Urbach edge measured by a constant photocurrent method (CPM) or photoluminescence spectroscopy and a smaller amount of absorption spectra of defective levels as compared to a conventional amorphous semiconductor. In other words, as compared to the conventional amorphous semiconductor, the amorphous silicon containing nitrogen is a well-ordered semiconductor having fewer defects and a steep tail of a level at a band edge in the valence band. Since the amorphous semiconductor containing nitrogen has a steep tail of a level at a band edge in the valence band, the band gap is wide and tunnel current does not flow easily. Therefore, when the amorphous semiconductor containing nitrogen is provided between the microcrystalline semiconductor region 111a and the impurity semiconductor film 113, the off-state current of the thin film transistor can be reduced. In addition, by providing the amorphous semiconductor containing nitrogen, the on-state current and the field-effect mobility can be increased.

Further, a peak region of a spectrum obtained by performing low-temperature photoluminescence spectroscopy on the amorphous semiconductor containing nitrogen is greater than or equal to 1.31 eV and less than or equal to 1.39 eV. Note that a peak region of a spectrum obtained by performing low-temperature photoluminescence spectroscopy on a microcrystalline semiconductor, typically a microcrystalline silicon, is greater than or equal to 0.98 eV and less than or equal to 1.02 eV. Accordingly, the amorphous semiconductor containing nitrogen is different from a microcrystalline semiconductor.

The microcrystalline semiconductor region 111a, as well as the amorphous semiconductor region 111b, may include a NH group or an NH$_2$ group.

Further, as illustrated in FIG. 5B, a semiconductor mixed phase grain 111c whose grain size is greater than or equal to 1 nm and less than or equal to 10 nm, preferably greater than or equal to 1 nm and less than or equal to 5 nm may be included in the amorphous semiconductor region 111b, so that the on-state current and the filed-effect mobility can be further increased.

A microcrystalline semiconductor having a projection (conical or pyramidal shape) whose width decreases from the gate insulating film 105 toward the amorphous semiconductor region 111b is formed in the following manner. After a microcrystalline semiconductor film is formed under the condition that a microcrystalline semiconductor is deposited, the crystal is partly made to grow and an amorphous semiconductor is deposited.

Since the microcrystalline semiconductor region 111a in the semiconductor film 111 has the conical or pyramidal shape or the inverted conical or pyramidal shape, resistance in a vertical direction (film thickness direction) of when voltage is applied between the source and drain electrodes in an on state, i.e., the resistance of the semiconductor film 111 can be lowered. Further, tunnel current does not easily flow since the amorphous semiconductor containing nitrogen is provided between the microcrystalline semiconductor region 111a and the impurity semiconductor film 113. The amorphous semiconductor containing nitrogen is a well-ordered semiconductor having few defects and a steep tail of a level at a band edge in the valence band. Thus, in the thin film transistor described in this embodiment, the on-state current and the field-effect mobility can be increased and the off-state current can be reduced.

Here, the semiconductor film 111 including the microcrystalline semiconductor region 111a and the amorphous semiconductor region 111b is formed with the use of a source gas of the semiconductor film 111, which includes a gas containing nitrogen. Alternatively, the semiconductor film 111 may be formed with the use of a source gas which includes hydrogen and a deposition gas containing silicon or germanium after nitrogen is adsorbed on the surface of the microcrystalline semiconductor film 109 by exposing the surface of the microcrystalline semiconductor film 109 to a gas containing nitrogen. Accordingly, the semiconductor film 111 including the microcrystalline semiconductor region 111a and the amorphous semiconductor region 111b can be formed.

The impurity semiconductor film 113 is formed using amorphous silicon to which phosphorus is added, microcrystalline silicon to which phosphorus is added, or the like. Alternatively, the impurity semiconductor film 113 can have a stacked structure of amorphous silicon to which phosphorus is added and microcrystalline silicon to which phosphorus is added. Note that, in the case of forming a p-channel thin film transistor as a thin film transistor, the impurity semiconductor film 113 is formed using microcrystalline silicon to which boron is added, amorphous silicon to which boron is added, or the like. In the case where the semiconductor film 111 achieves an ohmic contact with wirings 129a and 129b which are formed later, the impurity semiconductor film 113 is not necessarily formed.

The impurity semiconductor film 113 is formed in the treatment chamber of the plasma CVD apparatus by glow discharge plasma with the use of a mixture of hydrogen, phosphine (diluted with hydrogen or silane), and a deposition gas containing silicon, by which amorphous silicon to which phosphorus is added or microcrystalline silicon to which phosphorus is added is formed. In the case of manufacturing a p-type thin film transistor, the impurity semiconductor film 113 may be formed using glow discharge plasma using diborane instead of phosphine.

Further, in the case where the impurity semiconductor film 113 is formed using microcrystalline silicon to which phosphorus is added or microcrystalline silicon to which boron is added, a microcrystalline semiconductor film, typically a microcrystalline silicon film, is formed between the semiconductor film 111 and the impurity semiconductor film 113, so that characteristics of the interface can be improved. As a result, resistance generated at the interface between the impurity semiconductor film 113 and the semiconductor film 111 can be reduced. Therefore, the amount of current flowing through the source region, the semiconductor film, and the drain region of the thin film transistor can be increased and the on-state current and the field-effect mobility can be increased.

The resist mask 115 can be formed by a photolithography step.

Next, the seed 107, the microcrystalline semiconductor film 109, the semiconductor film 111, and the impurity semiconductor film 113 are etched using the resist mask 115. Through this step, the seed 107, the microcrystalline semiconductor film 109, the semiconductor film 111, and the impurity semiconductor film 113 are divided into elements, so that an island-shaped semiconductor stacked body 117 and an island-shaped impurity semiconductor film 121 are formed. The semiconductor stacked body 117 includes: a microcrystalline semiconductor region 117a which includes the seed 107, the microcrystalline semiconductor film 109, and the microcrystalline semiconductor region of the semiconductor film 111; and an amorphous semiconductor region 117b which includes the amorphous semiconductor region of the semiconductor film 111. Then, the resist mask 115 is removed (see FIG. 4D).

Figure 6A:
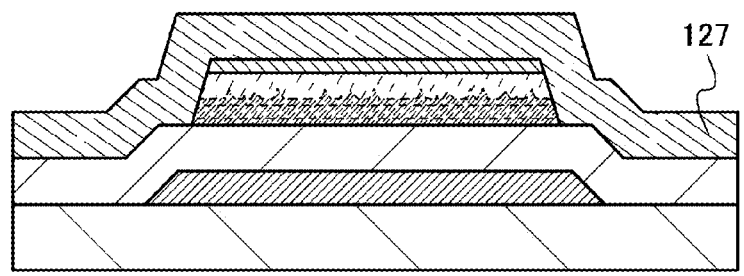
FIGS. 6A to 6C are cross-sectional views illustrating a method for manufacturing a semiconductor device, according to one embodiment of the present invention.

Next, a conductive film 127 is formed over the impurity semiconductor film 121 (see FIG. 6A). The conductive film 127 can be formed as a single layer or a stacked layer using any of aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode layer 103) may also be used. Alternatively, crystalline silicon to which an impurity element which serves as a donor is added may be used. Further, the conductive film 127 may have a stacked structure obtained as follows: a film, which is in contact with the crystalline silicon to which an impurity element serving as a donor is added, is formed using titanium, tantalum, molybdenum, tungsten, or nitride of any of these elements, and then aluminum or an aluminum alloy is formed thereover. Further alternatively, the conductive film 127 may have a stacked structure in which an upper side and a lower side of aluminum or an aluminum alloy are covered with titanium, tantalum, molybdenum, tungsten, or nitride of any of these elements. The conductive film 127 is formed by a CVD method, a sputtering method, or a vacuum evaporation method. Alternatively, the conductive film 127 may be formed by discharging a conductive nanopaste of silver, gold, copper, or the like by a screen printing method, an inkjet method, or the like and baking the conductive nanopaste.

Figure 6B:
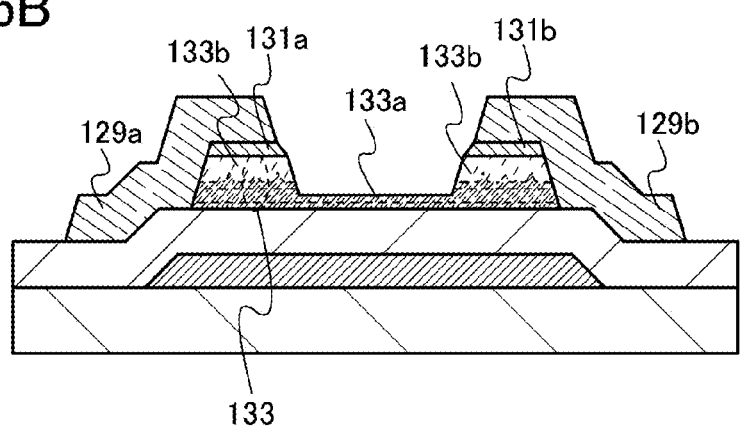

Then, a resist mask is formed by a photolithography step, and the conductive film 127 is etched with the use of the resist mask, so that the wirings 129a and 129b functioning as a source electrode and a drain electrode are formed (see FIG. 6B). The etching of the conductive film 127 may be either dry etching or wet etching. Note that one of the wirings 129a and 129b functions as a signal line as well as a source electrode or a drain electrode. However, without limitation thereto, a signal line may be provided separately from the source and drain electrodes.

Next, the impurity semiconductor film 121 and the semiconductor stacked body 117 are partly etched, so that a pair of impurity semiconductor films 131a and 131b functioning as a source and drain regions is formed. Also, a semiconductor stacked body 133 including a microcrystalline semiconductor region 133a and a pair of amorphous semiconductor regions 133b is formed. At this point, etching of the semiconductor stacked body 117 is performed so that the microcrystalline semiconductor region 133a is exposed, whereby the semiconductor stacked body 133 has the following structure. In regions which are covered with the wirings 129a and 129b, the microcrystalline semiconductor region 133a and the amorphous semiconductor regions 133b are stacked, and in a region which is covered with neither the wiring 129a nor the wiring 129b and overlaps with the gate electrode, the microcrystalline semiconductor region 133a is exposed.

Here, the ends of the wirings 129a and 129b are aligned with ends of the impurity semiconductor films 131a and 131b. However, the ends of the wirings 129a and 129b and the ends of the impurity semiconductor films 131a and 131b are not necessarily aligned with each other. In a cross section of such a case, the ends of the wirings 129a and 129b may be positioned on the inner side than the ends of the impurity semiconductor films 131a and 131b.

Next, dry etching may be performed. The dry etching is performed with a low etching rate of the microcrystalline semiconductor region 133a and the amorphous semiconductor regions 133b so that the exposed microcrystalline semiconductor region 133a and the exposed amorphous semiconductor regions 133b are not damaged. As an etching gas, $Cl_2$, $CF_4$, $N_2$, or the like is typically used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Next, the surfaces of the microcrystalline semiconductor region 133a and the amorphous semiconductor regions 133b are subjected to plasma treatment typified by water plasma treatment, oxygen plasma treatment, ammonia plasma treatment, nitrogen plasma treatment, plasma treatment using a mixed gas of oxygen and hydrogen, or the like.

Water plasma treatment can be performed in such a manner that a gas containing water as a main component typified by water vapor ($H_2O$ vapor) is introduced into a reaction space so that plasma is generated. After that, the resist mask is removed. The resist mask may be removed before the dry etching of the impurity semiconductor film 121 and the semiconductor stacked body 117.

As described above, after the microcrystalline semiconductor region 133a and the amorphous semiconductor regions 133b are formed, dry etching is additionally performed under the condition that no damage is given to the microcrystalline semiconductor region 133a and the amorphous semiconductor regions 133b, whereby an impurity such as a residue existing over the exposed microcrystalline semiconductor region 133a and the exposed amorphous semiconductor regions 133b can be removed. Further, after the dry etching, water plasma treatment is successively performed, whereby a residue of the resist mask can be removed and defects of the microcrystalline semiconductor region 133a can be reduced. Further, by the plasma treatment, insulation between the source region and the drain region can be ensured, and thus, in a completed thin film transistor, off-state current can be reduced, and a variation in electrical characteristics can be reduced.

Note that a resist mask formed by a photolithography step is provided over the conductive film 127, and the conductive film 127 is etched with the use of the resist mask, so that the wirings 129a and 129b functioning as a source electrode and a drain electrode are formed. Next, the impurity semiconductor film 121 is partly etched, so that the pair of impurity semiconductor films 131a and 131b functioning as a source electrode and a drain electrode is formed. At this time, part of the semiconductor stacked body 117 is etched in some cases. Next, the semiconductor stacked body 133 including the microcrystalline semiconductor region 133a and the pair of amorphous semiconductor regions 133b may be formed in the following manner: the resist mask is removed, and then part of the semiconductor stacked body 117 is etched.

In this manner, since the microcrystalline semiconductor region 117a is covered with the amorphous semiconductor region 117b in the step of removing the resist mask, the microcrystalline semiconductor region 117a is prevented from being in contact with the resist stripper and a residue of the resist. Further, since the amorphous semiconductor region 117b is etched using the wirings 129a and 129b to expose part of the microcrystalline semiconductor region 133a after the resist mask is removed, the amorphous semiconductor region which is in contact with the resist stripper and a residue of the resist is not left in the back channel. Consequently, leakage current due to the resist stripper and the residue of the resist left in the back channel is not generated, which can further reduce the off-state current of the thin film transistor.

Through the above-described process, a single-gate thin film transistor can be manufactured. A single-gate thin film transistor with low off-state current, high on-state current, and high field-effect mobility can be manufactured with high productivity.

Next, an insulating film 137 (also referred to as a second gate insulating film) is formed over the semiconductor stacked body 133 and the wirings 129a and 129b. The insulating film 137 can be formed in a manner similar to that of the gate insulating film 105.

Next, an opening (not illustrated) is formed in the insulating film 137 with the use of a resist mask formed by a photolithography step. Next, a back gate electrode 139 (also referred to as a second gate electrode) is formed over the insulating film 137 (see FIG. 6C). Through the above-described process, a dual-gate thin film transistor can be manufactured.

The back gate electrode 139 can be formed in a manner similar to that of the wirings 129a and 129b. Further, the back gate electrode 139 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the back gate electrode 139 can be formed using a conductive composition containing a light-transmitting conductive high molecule (also referred to as a light-transmitting conductive polymer). The back gate electrode 139 preferably has a sheet resistivity of 10000 Ω/sq. or lower and a light transmittance of 70% or higher at a wavelength of 550 nm. Further, the resistivity of the conductive high molecule included in the conductive composition is preferably 0.1 Ω·cm or lower.

As the conductive high molecule, a so-called π-electron conjugated conductive high molecule can be used. For example, polyaniline and/or a derivative thereof, polypyrrole and/or a derivative thereof, polythiophene and/or a derivative thereof, and a copolymer of two or more of aniline, pyrrole, and thiophene and/or a derivative thereof can be given.

The back gate electrode 139 can be formed in the following manner: a thin film is formed using any of the above materials by a sputtering method; and the thin film is etched using a resist mask that is formed by a photolithography step. Alternatively, the back gate electrode 139 can be formed by applying or printing a conductive composition including a conductive polymer having a light-transmitting property, and baking the composition.

Next, the shape of the back gate electrode is described with reference to FIGS. 7A to 7D that are top views of the thin film transistors.

Figure 7A:
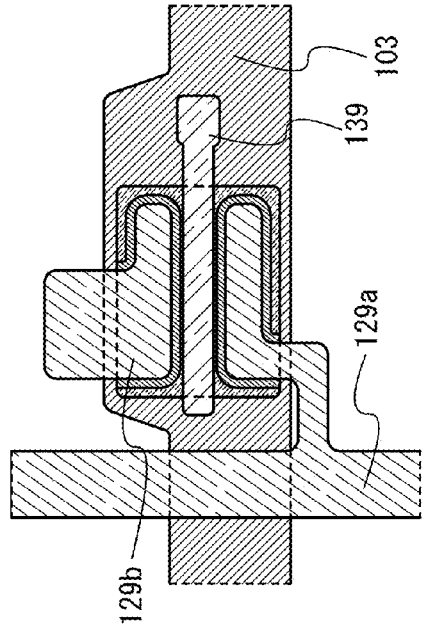
FIGS. 7A to 7D are top views each illustrating a method for manufacturing a semiconductor device, according to one embodiment of the present invention.

As illustrated in FIG. 7A, the back gate electrode 139 can be formed in parallel to the gate electrode 103. In this case, each of potential applied to the back gate electrode 139 and potential applied to the gate electrode 103 can be controlled independently. Thus, the threshold voltage of the thin film transistor can be controlled. Further, regions in which carriers flow, that is, channel regions are formed on the gate insulating film 105 side and on the insulating film 137 side in the microcrystalline semiconductor region; thus, the on-state current of the thin film transistor can be increased.

Figure 7C:
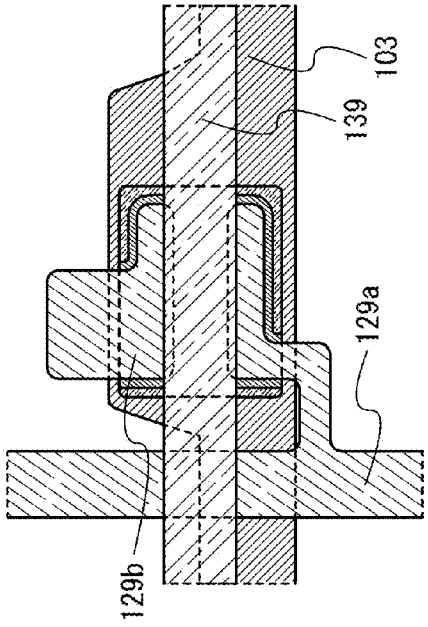
Figure 7B:
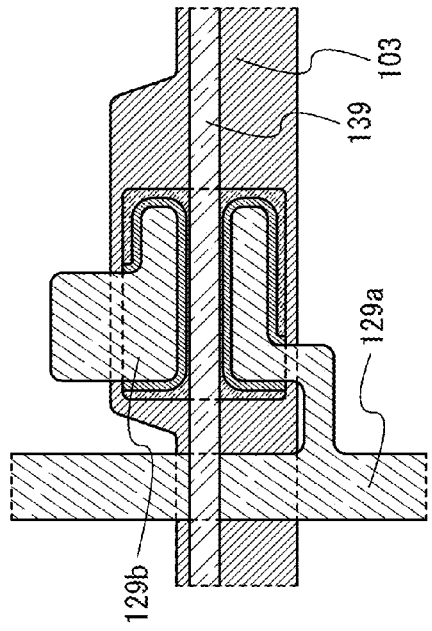

As illustrated in FIG. 7B, the back gate electrode 139 can be connected to the gate electrode 103. That is, the gate electrode 103 and the back gate electrode 139 can be connected through an opening 150 formed in the gate insulating film 105 and the insulating film 137. In this case, potential applied to the back gate electrode 139 and potential applied to the gate electrode 103 are equivalent. As a result, in the microcrystalline semiconductor region in the semiconductor film, regions in which carriers flow, that is, channels regions are formed on the gate insulating film 105 side and on the insulating film 137 side. Thus, the on-state current of the thin film transistor can be increased.

Further alternatively, as illustrated in FIG. 7C, the back gate electrode 139 is not necessarily connected to the gate electrode 103 and may be in a floating state. In that case, channel regions are formed on the gate insulating film 105 side and on the insulating film 137 side in the microcrystalline semiconductor region without potential applied to the back gate electrode 139; thus, the on-state current of the thin film transistor can be increased.

Figure 7D:
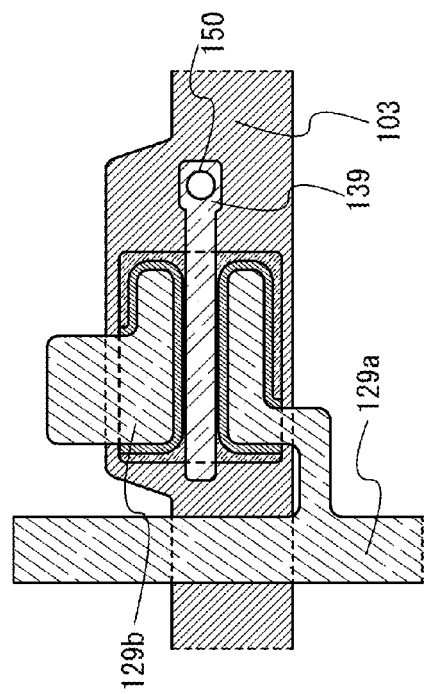

Further, as illustrated in FIG. 7D, the back gate electrode 139 may overlap with the wirings 129a and 129b with the insulating film 137 provided therebetween. Although the back gate electrode 139 having the structure of FIG. 7A is used in FIG. 7D, the back gate electrode 139 of FIG. 7B or FIG. 7C may also overlap with the wirings 129a and 129b.

In the single-gate thin film transistor and the dual-gate thin film transistor which are described in this embodiment, the channel region can be formed using a microcrystalline semiconductor film having high crystallinity with the space between the mixed phase grains reduced. Therefore, in the single-gate thin film transistor and dual-gate thin film transistor, the amount of transferring carriers is increased, so that the on-state current and the field-effect mobility can be increased. Furthermore, since the amorphous semiconductor regions 133b are provided between the microcrystalline semiconductor region 133a and the impurity semiconductor films 131a and 131b, the off-state current of the thin film transistor can be reduced. Accordingly, the area of the single-gate thin film transistor or the area of the dual-gate thin film transistor can be reduced, which enables high integration of a semiconductor device. Further, when the thin film transistor described in this embodiment is used for a driver circuit of a display device, the size of the driver circuit can be decreased, which enables the frame of the display device to be narrowed.

Note that in this embodiment, the microcrystalline semiconductor film is formed in accordance with Embodiment 1; however, the microcrystalline semiconductor film can also be formed in accordance with Embodiment 2. Further, when a dual-gate thin film transistor is formed using the microcrystalline semiconductor film described in Embodiment 2, the crystallinity of the microcrystalline semiconductor film is high on the back gate electrode side, so that the dual-gate thin film transistor can have further excellent electrical characteristics.

Embodiment 4

In this embodiment, a method for manufacturing a thin film transistor, by which the off-state current can be further reduced as compared with that in Embodiment 3, will be described with reference to FIGS. 4A to 4D and FIGS. 8A to 8C.

Figure 8A:
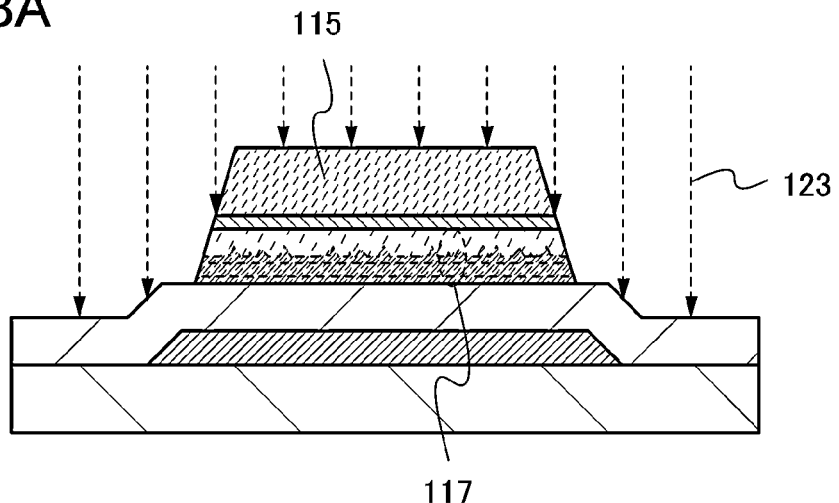
FIGS. 8A to 8C are cross-sectional views illustrating a method for manufacturing a semiconductor device, according to one embodiment of the present invention.

As in Embodiment 3, the semiconductor stacked body 117 in FIG. 8A is formed through the process illustrated in FIGS. 4A to 4C.

Next, plasma treatment is performed in which a side surface of the semiconductor stacked body 117 is exposed to plasma 123 with the resist mask 115 left. Here, plasma is generated in an oxidizing gas atmosphere or a nitriding gas atmosphere, and the semiconductor stacked body 117 is exposed to the plasma 123. Examples of the oxidizing gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. Generation of plasma in an oxidizing gas or a nitriding gas causes an oxygen radical or a nitrogen radical to be generated. The radical reacts with the semiconductor stacked body 117, which forms an insulating region functioning as a barrier region on the side surface of the semiconductor stacked body 117. Note that instead of irradiation with plasma, irradiation with ultraviolet light may be performed for generation of an oxygen radical or a nitrogen radical.

Figure 8B:
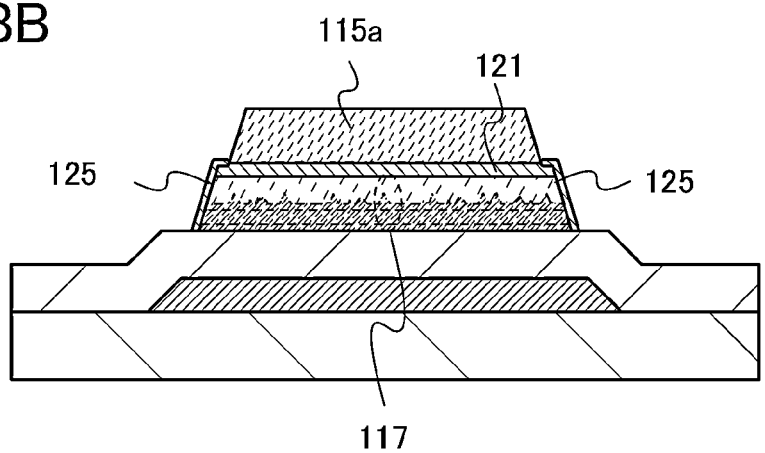
Figure 8C:
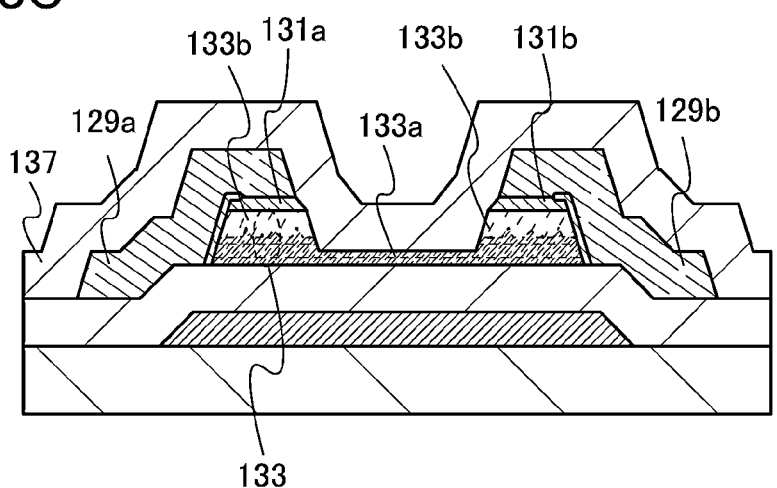

In the case of using oxygen, ozone, water vapor, or a mixed gas of oxygen and hydrogen as the oxidizing gas, the resist recedes by plasma irradiation, so that a resist mask 115a having a smaller bottom surface than the resist mask 115 is formed as illustrated in FIG. 8B. Consequently, through the plasma treatment, the exposed impurity semiconductor film 121 is oxidized in addition to the side surface of the semiconductor stacked body 117, so that an insulating region 125 functioning as a barrier region is formed on the side surface and part of the top surface of the impurity semiconductor film 121 and the side surface of the semiconductor stacked body 117.

Figure 6C:
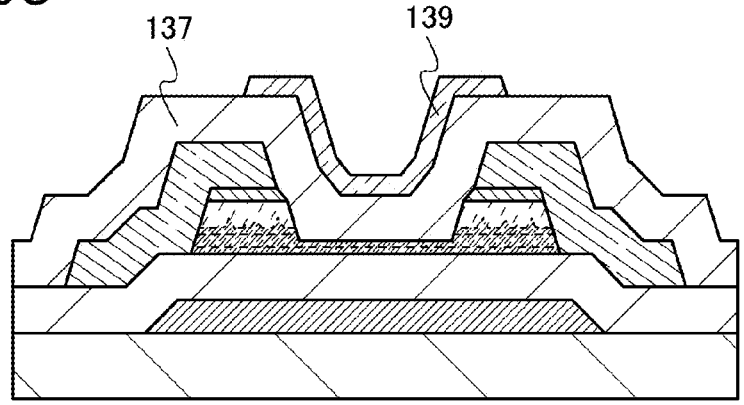

Next, as described in Embodiment 3, through the process illustrated in FIGS. 6A and 6B, the wirings 129a and 129b functioning as a source electrode and a drain electrode, the pair of impurity semiconductor films 131a and 131b functioning as a source region and a drain region, the semiconductor stacked body 133 including the microcrystalline semiconductor region 133a and the pair of amorphous semiconductor regions 133b, and the insulating film 137 are formed as illustrated in FIG. 6C. Accordingly, a single-gate thin film transistor can be manufactured.

When a back gate electrode is formed over the insulating film 137, a dual-gate thin film transistor can be manufactured.

In the single-gate thin film transistor and the dual-gate thin film transistor which are described in this embodiment, the channel region can be formed using a microcrystalline semiconductor film having high crystallinity with the space between the mixed phase grains reduced. Furthermore, since the insulating region which is a barrier region is provided between the semiconductor stacked body 133 and the wiring 129a and 129b, holes injected from the wirings 129a and 129b to the semiconductor stacked body 133 can be reduced, so that the off-state current of the thin film transistor is reduced and the on-state current and the field-effect mobility thereof are increased. Therefore, the size of the thin film transistor can be decreased, and high integration of a semiconductor device can be achieved. Further, when the thin film transistor described in this embodiment is used for a driver circuit of a display device, the size of the driver circuit can be decreased, which enables the frame of the display device to be narrowed.

In this embodiment, the description is made in accordance with Embodiment 3; however, the description may be made in accordance with another embodiment as appropriate.

Embodiment 5

Figure 9:
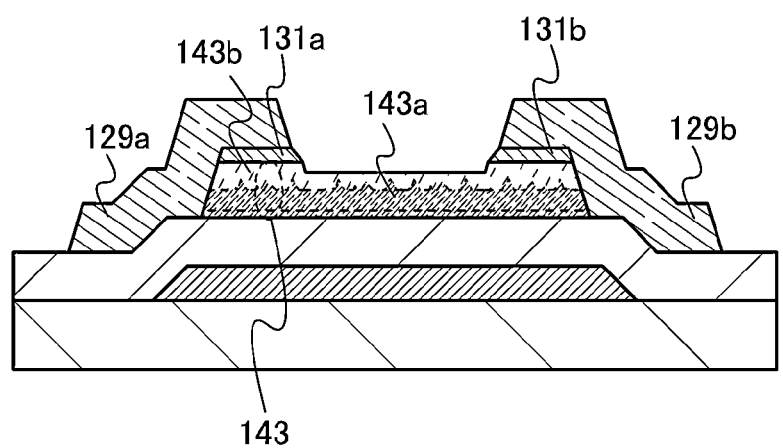
FIG. 9 is a cross-sectional view illustrating a method for manufacturing a semiconductor device, according to one embodiment of the present invention.

In this embodiment, a method for manufacturing a thin film transistor formed in a semiconductor device that is one embodiment of the present invention will be described with reference to FIGS. 5A and 5B, FIGS. 6A to 6C, and FIG. 9. FIG. 9 corresponds to the step illustrated in FIG. 6B.

As in Embodiment 3, the conductive film 127 is formed through the process of FIGS. 4A to 4D and FIG. 6A.

Then, as illustrated in FIG. 9, the wirings 129a and 129b are formed and the impurity semiconductor film 121 and the semiconductor stacked body 117 are partly etched, so that the pair of impurity semiconductor films 131a and 131b serving as a source region and a drain region is formed as in Embodiment 3. Further, the semiconductor stacked body 143 including the microcrystalline semiconductor region 143a and the amorphous semiconductor region 143b is also formed. At this time, the etching of the semiconductor stacked body 117 is performed so that the amorphous semiconductor region 143b is exposed, whereby the semiconductor stacked body 143 is formed in which the microcrystalline semiconductor region 143a and the amorphous semiconductor region 143b are stacked in a region which is covered with the wiring 129a and 129b, and the microcrystalline semiconductor region 143a is not exposed and the amorphous semiconductor region 143b is exposed in a region which is covered with neither the wiring 129a nor the wiring 129b and overlaps with the gate electrode. Note that the etching amount of the semiconductor stacked body 117 here is smaller than that in the case of FIG. 6B.

The subsequent steps are similar to those in Embodiment 3.

Through the above-described process, a single-gate thin film transistor can be manufactured. Since the back channel side of the thin film transistor is amorphous, the off-state current can be reduced as compared to the thin film transistor illustrated in FIG. 6B.

Further in this embodiment, after the step illustrated in FIGS. 6A to 6C, the back gate electrode 139 may be formed over the insulating film 137 as in the step illustrated in FIG. 6C.

This embodiment can be implemented in appropriate combination with any of the other embodiments.

Embodiment 6

A thin film transistor is manufactured, and a semiconductor device having a display function (also referred to as a display device) can be manufactured using the thin film transistor in a pixel portion and further in a driver circuit. Further, part or the whole of the driver circuit which includes thin film transistors can be formed over the same substrate as the pixel portion, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. The display device also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP which is provided with a printed wiring board at the end thereof; and a module in which an integrated circuit (IC) is directly mounted on a display element by chip on glass (COG).

Embodiment 7

In this embodiment, a photoelectric conversion device that is one embodiment of a semiconductor device will be described. In the photoelectric conversion device described in this embodiment, as described in Embodiment 1 and Embodiment 2, a microcrystalline semiconductor film having high crystallinity with the space between mixed phase grains reduced is used as a semiconductor film. The microcrystalline semiconductor film having high crystallinity with the space between mixed phase grains reduced is applicable to a semiconductor film having a function of photoelectric conversion, a semiconductor film having a conductivity type, or the like, and is preferably applied to the semiconductor film having a function of photoelectric conversion in particular. Further, the microcrystalline semiconductor film having high crystallinity with the space between mixed phase grains reduced can be provided at an interface between the semiconductor film having a function of photoelectric conversion or the semiconductor film having a conductivity type and another film.

By employing the structure described above, resistance (series resistance) caused by the semiconductor film having a function of photoelectric conversion or the semiconductor film having a conductivity type can be reduced, resulting in improvement of characteristics of the photoelectric conversion device. Further, it is possible to suppress optical and electrical loss at the interface between the semiconductor film having a function of photoelectric conversion or the semiconductor film having a conductivity type and another film, so that the photoelectric conversion efficiency can be improved. With reference to FIGS. 10A to 10E, one embodiment of a method for manufacturing a photoelectric conversion device will be described.

Figure 10A:
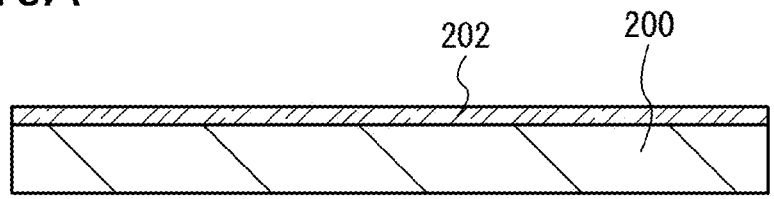
FIGS. 10A to 10E are cross-sectional views illustrating one embodiment of a method for manufacturing a photoelectric conversion device.

As illustrated in FIG. 10A, a first electrode 202 is formed over a substrate 200.

As the substrate 200, the substrate 51 described in Embodiment 1 can be used as appropriate. Alternatively, a plastic substrate can be used. As the plastic substrate, it is preferable to use a substrate containing a thermosetting resin such an epoxy resin, an unsaturated polyester resin, a polyimide resin, a bismaleimide-triazine resin, or a cyanate resin, or a substrate containing a thermoplastic resin such as a polyphenylene oxide resin, a polyetherimide resin, or a fluorine resin.

Note that a surface of the substrate 200 may have a texture structure. Accordingly, photoelectric conversion efficiency can be improved.

In this embodiment, since light enters from the back side (the lower part in the drawing) of the substrate 200, a light-transmitting substrate is used. However, when a structure is employed in which light enters from the side of the second electrode 210 to be formed later (i.e., the upper part in the drawing), the substrate is not limited to a light-transmitting substrate. In this case, a semiconductor substrate containing a material such as silicon or a conductive substrate containing a metal material or the like may be used.

The first electrode 202 can be formed using a light-transmitting conductive material used for the back gate electrode 139 described in Embodiment 3. The first electrode 202 is formed by a sputtering method, a CVD method, a vacuum evaporation method, a coating method, a printing method, or the like.

The first electrode 202 is formed to a thickness of 10 nm to 500 nm, preferably 50 nm to 100 nm. The sheet resistance of the first electrode 202 is set to about 20 Ω/sq. to 200 Ω/sq.

Note that in this embodiment, since light enters from the back side (the lower part in the drawing) of the substrate 200, the first electrode 202 is formed using a light-transmitting conductive material. However, when a structure is employed in which light enters from the side of the second electrode 210 to be formed later (i.e., the upper part in the drawing), the material of the first electrode 202 is not limited to such a light-transmitting conductive material. In such a case, the first electrode 202 can be formed using a conductive material that does not have a light-transmitting property such as aluminum, platinum, gold, silver, copper, titanium, tantalum, or tungsten. In particular, when a material that easily reflects light, such as aluminum, silver, titanium, or tantalum, is used, photoelectric conversion efficiency can be sufficiently improved.

Like the substrate 200, the first electrode 202 may have a texture structure. Further, an auxiliary electrode containing a low-resistance conductive material may be separately formed so as to be in contact with the first electrode 202.

Figure 10B:
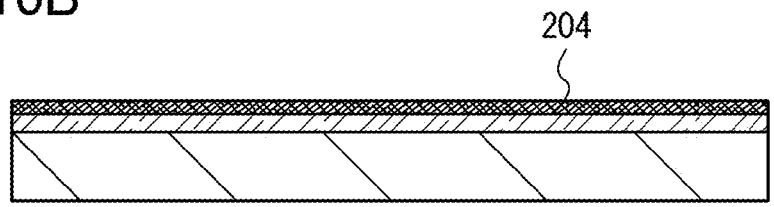

Next, as illustrated in FIG. 10B, a semiconductor film 204 having the first conductivity type is formed over the first electrode 202. The semiconductor film 204 having the first conductivity type is typically formed using a semiconductor film containing a semiconductor material to which an impurity element imparting a conductivity type is added. As the semiconductor material, silicon is preferably used in view of productivity, cost, and the like. When silicon is used as the semiconductor material, phosphorus or arsenic, which imparts n-type conductivity, aluminum or boron, which imparts p-type conductivity, or the like is used as the impurity element imparting a conductivity type.

In this embodiment, since light enters from the back side (the lower part in the drawing) of the substrate 200, the conductivity type (first conductivity type) of the semiconductor film 204 having the first conductivity type is preferably a p-type. This is because, for instance, the diffusion length of holes is short as a result of the lifetime of a hole which is as short as half that of an electron, and because more electrons and holes are formed on the side where light enters in the semiconductor film 206 having a function of photoelectric conversion. By applying a p-type to the first conductivity type, current can be extracted before holes are annihilated, whereby a decrease in photoelectric conversion efficiency can be suppressed. Note that when there is no possibility of the above problems, for example, when the semiconductor film 206 having a function of photoelectric conversion is sufficiently thin, the first conductivity type may be an n-type.

There are other semiconductor materials which can be used for the semiconductor film 204 having the first conductivity type, such as silicon carbide, germanium, gallium arsenide, indium phosphide, zinc selenide, gallium nitride, and silicon germanium. Alternatively, a semiconductor material containing an organic material, a semiconductor material containing a metal oxide, or the like can be used. The material which can be used for the semiconductor film 204 having the first conductivity type can be selected as appropriate in consideration of the semiconductor film 206 having a function of photoelectric conversion.

Although there is no particular limitation on the crystallinity of the semiconductor film 204 having the first conductivity type, the microcrystalline semiconductor film having high crystallinity with the space between mixed phase grains reduced which is described in Embodiment 1 or Embodiment 2 is preferably used as the semiconductor film 204 having the first conductivity type. This is because in this case, as compared with the use of a conventional microcrystalline semiconductor film, it is possible to reduce series resistance and to suppress optical and electrical loss at the interface between the microcrystalline semiconductor film having high crystallinity and another film. It is needless to say that other semiconductors such as an amorphous semiconductor, a polycrystalline semiconductor, and a single crystal semiconductor can also be used.

Like the surface of the substrate 200, a surface of the semiconductor film 204 having the first conductivity type may have a texture structure.

The semiconductor film 204 having the first conductivity type can be formed using diborane and a deposition gas containing silicon by a plasma CVD method. Further, the semiconductor film 204 having the first conductivity type is formed to a thickness of 1 nm to 100 nm, preferably 5 nm to 50 nm.

Alternatively, the semiconductor film 204 having the first conductivity type may be formed as follows: a silicon film to which an impurity element imparting a conductivity type is not added is formed by a plasma CVD method or the like; and boron is added by an ion implantation method or the like.

Figure 10C:
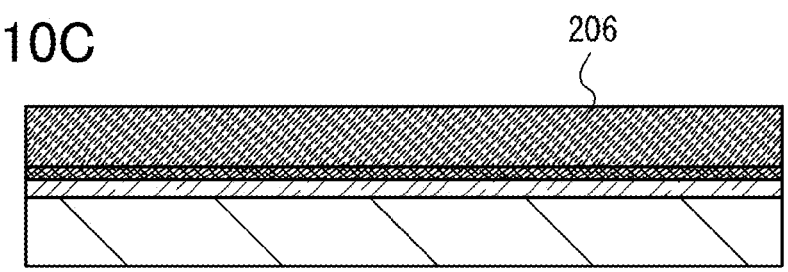

Next, as illustrated in FIG. 10C, the semiconductor film 206 having a function of photoelectric conversion is formed over the semiconductor film 204 having the first conductivity type. For the semiconductor film 206 having a function of photoelectric conversion, a semiconductor film containing a semiconductor material which is similar to that of the semiconductor film 204 is used. That is, as the semiconductor material, silicon, silicon carbide, germanium, gallium arsenide, indium phosphide, zinc selenide, gallium nitride, silicon germanium, or the like is used. In particular, silicon is preferably used. Alternatively, a semiconductor material containing an organic material, a semiconductor material containing a metal oxide, or the like can be used.

As the semiconductor film 206 having a function of photoelectric conversion, as described in Embodiment 1 or Embodiment 2, the microcrystalline semiconductor film having high crystallinity with the space between mixed phase gains reduced is preferably used. By applying the microcrystalline semiconductor film having high crystallinity with the space between mixed phase grains reduced described in Embodiment 1 and Embodiment 2 to the semiconductor film, as compared with the use of a conventional microcrystalline semiconductor film, it is possible to reduce series resistance and to suppress optical and electrical loss at the interface between the microcrystalline semiconductor film having high crystallinity and another film.

Because the semiconductor film 206 having a function of photoelectric conversion needs to exhibit sufficient light absorption, it preferably has a thickness of about 100 nm to 10 μm.

Figure 10D:
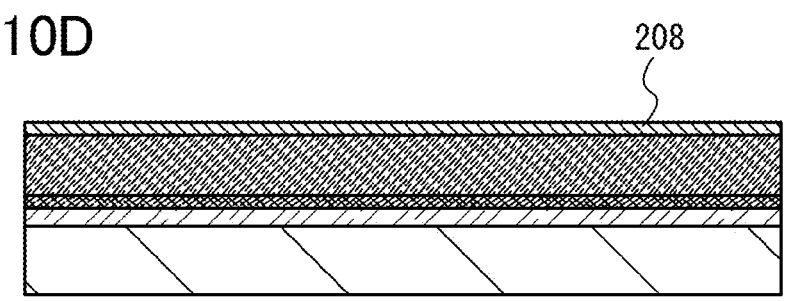

Next, as illustrated in FIG. 10D, a semiconductor film 208 having the second conductivity type is formed over the semiconductor film 206 having a function of photoelectric conversion. In this embodiment, the second conductivity type is an n-type. The semiconductor film 208 having the second conductivity type can be formed using a material such as silicon to which phosphorus is added as an impurity element imparting a conductivity type. Semiconductor materials that can be used for the semiconductor film 208 having the second conductivity type are the same as those for the semiconductor film 204 having the first conductivity type.

The semiconductor film 208 having the second conductivity type can be formed like the semiconductor film 204 having the first conductivity type. For instance, the semiconductor film 208 having the second conductivity type can be formed using phosphine and a deposition gas containing silicon by a plasma CVD method. As the semiconductor film 208 having the second conductivity type, as described in Embodiment 1 or Embodiment 2, the microcrystalline semiconductor film having high crystallinity with the space between mixed phase grains reduced is preferably used.

In this embodiment, since light enters from the back side (the lower part in the drawing) of the substrate 200, the conductivity type (second conductivity type) of the semiconductor film 208 is preferably an n-type, but one embodiment of the present invention is not limited thereto. When the first conductivity type is an n-type, the second conductivity type is a p-type.

Figure 10E:
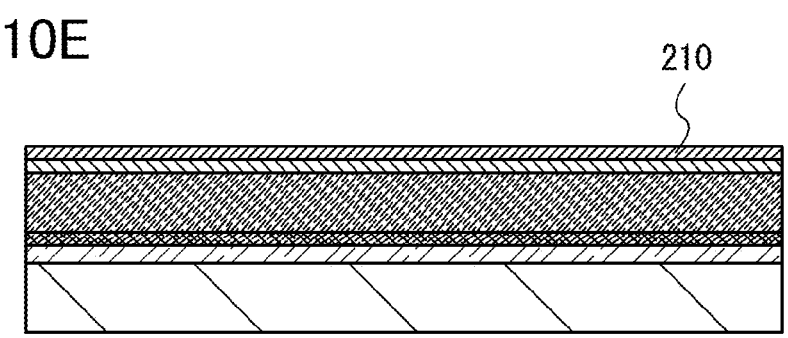

Then, as illustrated in FIG. 10E, the second electrode 210 is formed over the semiconductor film 208 having the second conductivity type. The second electrode 210 is formed using a conductive material such as metal. They can be formed using a material that easily reflects light, such as aluminum, silver, titanium, or tantalum, for instance. Such a material is preferably used because light that cannot be absorbed by the semiconductor film 206 can be incident on the semiconductor film 206 again; thus, photoelectric conversion efficiency can be improved.

As a method of forming the second electrode 210, there are a sputtering method, a vacuum evaporation method, a CVD method, a coating method, a printing method, and the like. Further, the second electrode 210 is formed to a thickness of 10 nm to 500 nm, preferably 50 nm to 100 nm.

Note that in this embodiment, since light enters from the back side (the lower part in the drawing) of the substrate 200, the second electrode 210 is formed using a material that has no light-transmitting property; however, the structure of the second electrode 210 is not limited thereto. For example, when light enters from the second electrode 210 side (the upper part in the drawing), the second electrode 210 can be formed using any of the light-transmitting conductive materials for the first electrode 202.

Further, an auxiliary electrode containing a low-resistance conductive material may be formed so as to be in contact with the second electrode 210.

By the above method, it is possible to manufacture a photoelectric conversion device in which a microcrystalline semiconductor film having high crystallinity with the space between the mixed phase grains reduced is used as any of a semiconductor film having a function of photoelectric conversion, a semiconductor film having the first conductivity type, and a semiconductor film having the second conductivity type. This can enhance the photoelectric conversion efficiency of a photoelectric conversion device. Note that, as long as the microcrystalline semiconductor film having high crystallinity with the space between the mixed phase grains reduced is used as one of the semiconductor film having a function of photoelectric conversion, the semiconductor film having the first conductivity type, and the semiconductor film having the second conductivity type, the film to which the microcrystalline semiconductor film is applied can be changed as appropriate. Further, when the microcrystalline semiconductor films having high crystallinity with the space between the mixed phase grains reduced are used as a plurality of films of the above semiconductor films, the photoelectric conversion efficiency can be more effectively enhanced.

Note that although a photoelectric conversion device having one unit cell is described in this embodiment, a photoelectric conversion device may have two or more stacked unit cells as appropriate.

This embodiment can be implemented in appropriate combination with any of the other embodiments.

Embodiment 8

A semiconductor device disclosed in this specification can be applied to an electronic paper. An electronic paper can be used for electronic devices of a variety of fields as long as they display data. For example, an electronic paper can be applied to an e-book reader (electronic book), a poster, a digital signage, a public information display (PID), an advertisement in a vehicle such as a train, or displays of various cards such as a credit card. An example of the electronic device is illustrated in FIG. 11.

Figure 11:
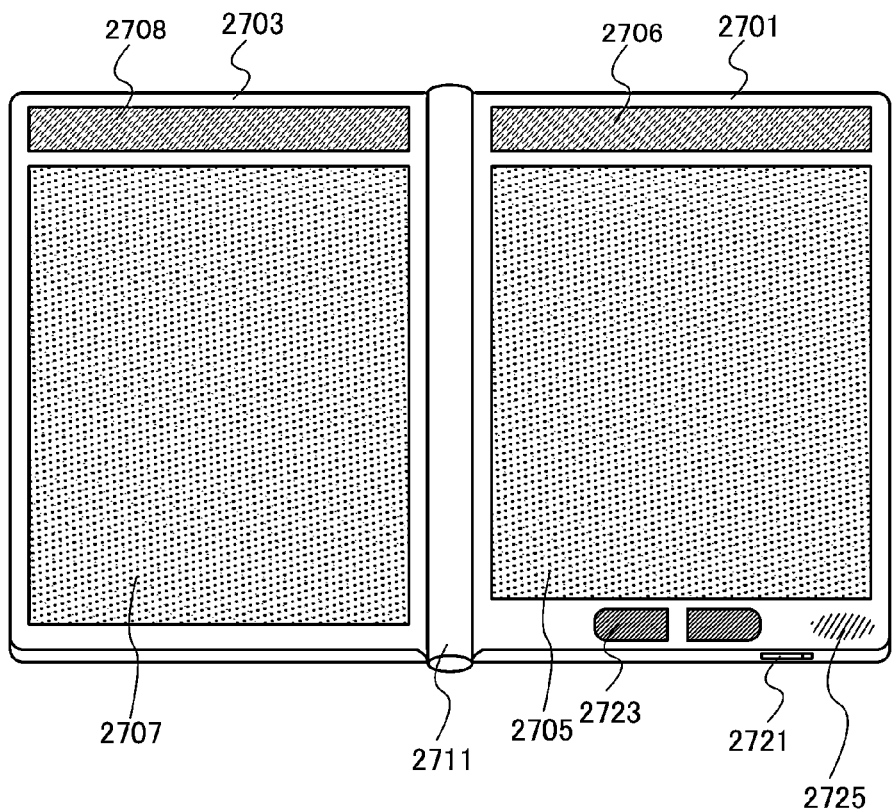
FIG. 11 is a perspective view illustrating one example of an electronic book reader.

FIG. 11 illustrates an example of an electronic book reader. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. In the structure where different images are displayed in the above display portions, for example, the right display portion (the display portion 2705 in FIG. 11) can display text and the left display portion (the display portion 2707 in FIG. 11) can display images.

FIG. 11 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, or the like may be provided on the back surface or the side surface of the housing. Moreover, the electronic book reader 2700 may have a function of an electronic dictionary.

Further, the electronic book reader 2700 may send and receive data wirelessly. Through wireless communication, desired book data or the like can be purchased and downloaded from an electronic book server.

Embodiment 9

A semiconductor device disclosed in this specification can be applied to a variety of electronic devices (including amusement machines). Examples of electronic devices include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 12A:
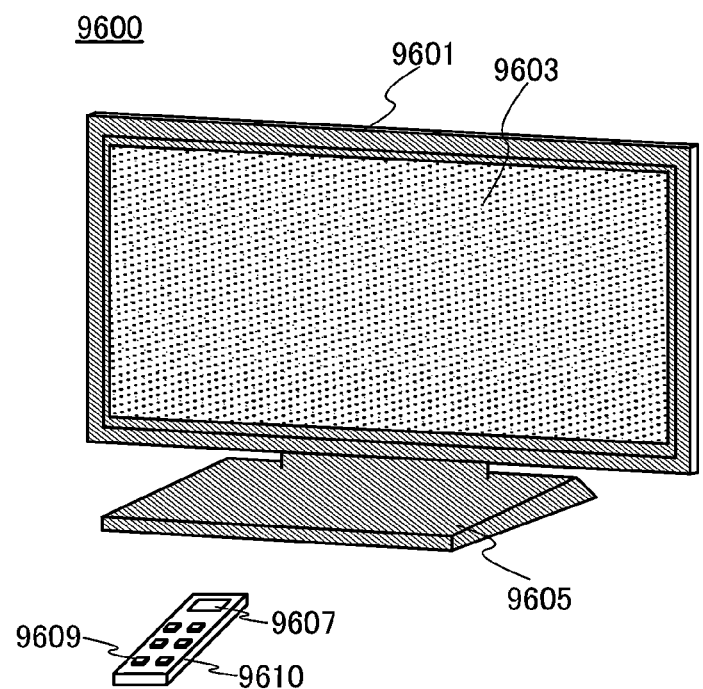
FIGS. 12A and 12B are perspective views illustrating examples of a television set and a digital photo frame.

FIG. 12A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 which displays data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 12B:
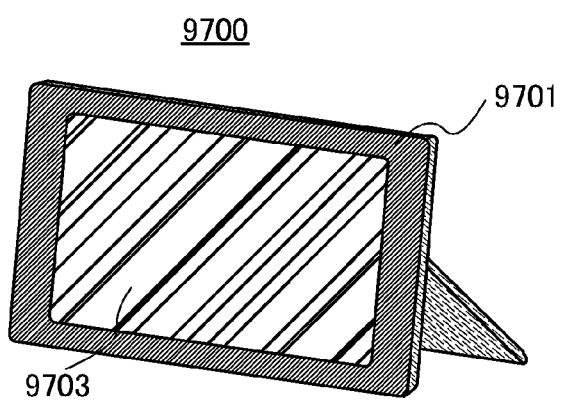

FIG. 12B illustrates an example of a digital photo frame. For example, in a digital photo frame 9700, a display portion 9703 is incorporated in a housing 9701. Various images can be displayed on the display portion 9703. For example, the display portion 9703 can display image data taken with a digital camera or the like, whereby the digital photo frame 9700 can function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion 9703, it is preferable to provide them on the side surface or the back surface because the design thereof is improved. For example, a memory in which image data taken with a digital camera is stored is inserted in the recording medium insertion portion of the digital photo frame, whereby the image data can be displayed on the display portion 9703.

The digital photo frame 9700 may send and receive data wirelessly. Through wireless communication, desired image data can be downloaded to be displayed.

Figure 13:
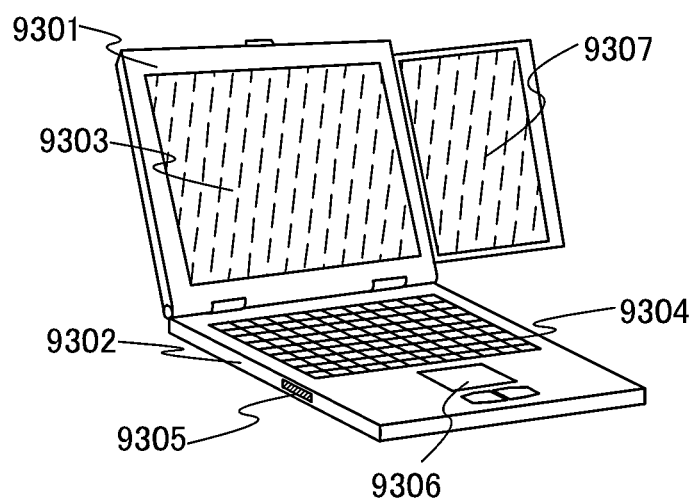
FIG. 13 is a perspective view illustrating one example of a portable computer.

FIG. 13 is a perspective view illustrating an example of a portable computer.

In the portable computer in FIG. 13, a top housing 9301 having a display portion 9303 and a bottom housing 9302 having a keyboard 9304 can overlap with each other by closing a hinge unit which connects the top housing 9301 and the bottom housing 9302. The portable computer in FIG. 13 is convenient for carrying, and in the case of using the keyboard for input, the hinge unit is opened so that the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 is formed using an image display device such as a liquid crystal display panel or a light-emitting display panel including an organic light-emitting element, an inorganic light-emitting element, or the like.

In addition, the portable computer in FIG. 13, which can be provided with a receiver and the like, can receive a television broadcast to display an image on the display portion. While the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit which displays the television broadcast is performed. Therefore, power consumption can be minimized, which is advantageous for the portable computer whose battery capacity is limited.

Example 1

In this example, relations between the etching rates of a microcrystalline silicon film and an amorphous silicon film and the pressure will be described with reference to FIG. 14.

First, methods for manufacturing etching samples will be described.

In Sample 1, a film to be etched is an amorphous silicon film. Here, a 100-nm-thick amorphous silicon film was formed over a glass substrate. For deposition of the amorphous silicon film, a plasma CVD method was used in which plasma discharge was performed under the following condition: silane and hydrogen were introduced as a source gas at flow rates of 100 sccm and 75 sccm, respectively; the pressure in a treatment chamber was 100 Pa; the RF power source frequency was 13.56 MHz; the power of the RF power source was 30 W; the upper electrode temperature was 250° C.; and the lower electrode temperature was 290° C.

In Sample 2, a film to be etched is a microcrystalline silicon film. Here, a 300-nm-thick silicon nitride film was formed over a glass substrate, and was subjected to plasma treatment. Next, a 5-nm-thick seed was formed under the first condition described in Embodiment 1, and then a 65-nm-thick microcrystalline silicon film was formed under the second condition described in Embodiment 1 (without a cycle flow).

The gate insulating film 105 was formed using a silicon nitride film. The thickness of the silicon nitride film was 300 nm. The silicon nitride film was formed by a plasma CVD method.

The silicon nitride film was formed by plasma discharge performed under the following condition: silane, hydrogen, nitrogen, and ammonia were introduced as a source gas at flow rates of 15 sccm, 200 sccm, 180 sccm, and 500 sccm, respectively; the pressure in a treatment chamber was 100 Pa; the substrate temperature was 250° C.; the RF power source frequency was 13.56 MHz; and the power of the RF power source was 200 W.

Plasma treatment for the silicon nitride film was performed by plasma discharge at 300 W under the following condition: dinitrogen monoxide ($N_2O$) was introduced at a flow rate of 400 sccm and the pressure in the treatment chamber was 60 Pa. Note that the above-described plasma treatment was performed using a parallel-plate plasma apparatus, with the upper electrode temperature and the lower electrode temperature set at 250° C. and 290° C., respectively.

For the deposition of the seed, a plasma CVD method was used in which plasma discharge was performed under the following condition: silane, hydrogen, and argon were introduced as a source gas at flow rates of 4 sccm, 750 sccm, and 750 sccm, respectively; the pressure in the treatment chamber was 532 Pa; the RF power source frequency was 13.56 MHz;

the power of the RF power source was 150 W; the upper electrode temperature was 250° C.; and the lower electrode temperature was 290° C.

For the deposition of the microcrystalline silicon film, a plasma CVD method was used in which plasma discharge was performed under the following condition: silane, hydrogen, and argon were introduced as a source gas at flow rates of 1.8 sccm, 750 sccm, and 750 sccm, respectively; the pressure in the treatment chamber was 5000 Pa; the RF power source frequency was 13.56 MHz; the power of the RF power source was 125 W; the upper electrode temperature was 250° C.; and the lower electrode temperature was 290° C.

Next, Sample 1 and Sample 2 were each subjected to etching treatment with the pressure changed, and the etching rates were measured.

For the etching, a plasma etching method was used in which plasma discharge was performed for 600 seconds under the following conditions: hydrogen and argon were introduced as an etching gas at flow rates of 1500 sccm and 1500 sccm, respectively; the RF power source frequency was 13.56 MHz; the upper electrode temperature was 250° C.; and the lower electrode temperature was 290° C. In each of Sample 1 and Sample 2, the pressure in the treatment chamber was changed in the following manner: 1000 Pa, 2000 Pa, 3000 Pa, 4000 Pa, 5000 Pa, and 10000 Pa. In addition, the power of the RF power source was changed in the following manner: 100 W, and 150 W.

Figure 14:
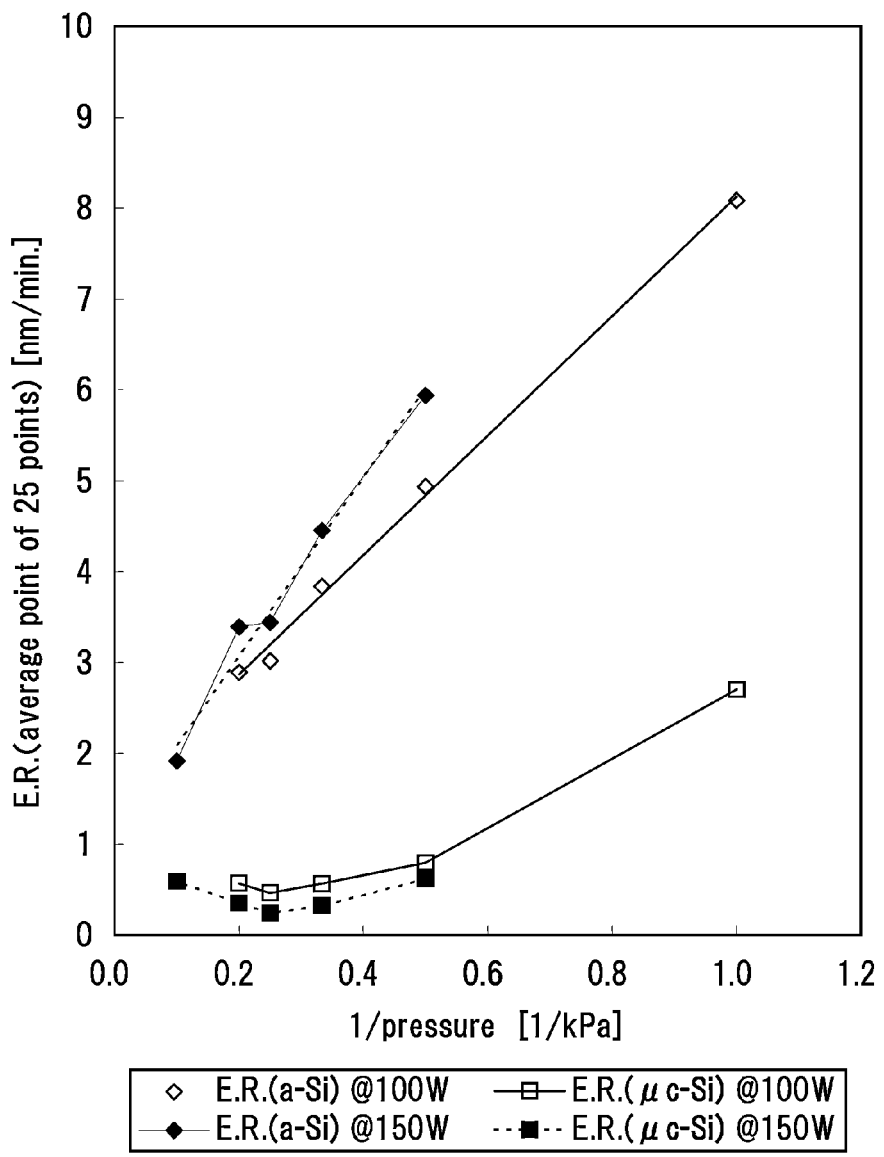
FIG. 14 is a graph showing the etching rate of a semiconductor film.

FIG. 14 shows a relation between the pressure and the etching rate at this time. The horizontal axis represents 1/pressure (1/kPa), and the vertical axis represents the etching rate (nm/min).

The etching rates of Sample 1 (the film to be etched is the amorphous silicon film) are denoted by rhombuses. The etching rates in the case where the power of the RF power source was 100 W with the pressure set to 1000 Pa to 5000 Pa are denoted by white rhombuses. The etching rates in the case where the power of the RF power source was 150 W with the pressure set to 2000 Pa to 10000 Pa are denoted by black rhombuses.

The etching rates of Sample 2 (the film to be etched is the microcrystalline silicon film) are denoted by squares. The etching rates in the case where the power of the RF power source was 100 W with the pressure set to 1000 Pa to 5000 Pa are denoted by white squares. The etching rates in the case where the power of the RF power source was 150 W with the pressure set to 2000 Pa to 10000 Pa are denoted by black squares.

The etching rate of Sample 2 (the film to be etched is the microcrystalline silicon film) was high when the pressure was 1000 Pa (that is, when the value of 1/pressure (1/kPa) represented by the horizontal axis was 1). However, the etching rate was low when the pressure was 2000 Pa or higher (that is, the value of 1/pressure (1/kPa) represented by the horizontal axis was 0.5 or less), and the microcrystalline silicon film was hardly etched.

On the other hand, the etching rate of Sample 1 (the film to be etched was the amorphous silicon film) was decreased substantially linearly with a pressure of 1000 Pa to 10000 Pa, but the amorphous silicon film was etched.

These indicate that an amorphous silicon film can be selectively etched with the use of plasma which is generated in a treatment chamber having a hydrogen atmosphere with a pressure of at least 2000 Pa, without a microcrystalline silicon film being etched.

These indicate the following. In the case where a silane cycle flow is performed under the second condition of Embodiment 1 or 2, there is a period during which the flow rate of silane is periodically decreased drastically. In this period, plasma is generated mainly in a hydrogen atmosphere. Therefore, an amorphous semiconductor of a microcrystalline semiconductor film deposited over a seed can be selectively etched. As a result, the microcrystalline semiconductor film can have high crystallinity.

Example 2

In this example, the surface structure, the crystallinity, and the size of the crystallite of the microcrystalline semiconductor film in Embodiment 1 will be described with reference to FIGS. 15A and 15B and FIGS. 16A and 16B.

First, methods for manufacturing samples will be described.

Sample 3 and Sample 5 were each manufactured in such a manner that a microcrystalline silicon film was formed by the method described in Embodiment 1.

In each of Sample 3 and Sample 5, a 300-nm-thick silicon nitride film was formed over a glass substrate, and was subjected to plasma treatment. Next, a 5-nm-thick seed was formed under the first condition described in Embodiment 1, and then a 30-nm-thick microcrystalline silicon film was formed under the second condition described in Embodiment 1.

Here, the deposition condition and the plasma treatment condition of the silicon nitride film in Sample 2 described in Example 1 were employed.

For the deposition of the seed in each of Sample 3 and Sample 5, a plasma CVD method was used in which plasma discharge was performed under the following condition: silane, hydrogen, and argon were introduced as a source gas at flow rates of 4 sccm, 750 sccm, and 750 sccm, respectively; the pressure in a treatment chamber was 532 Pa; the RF power source frequency was 13.56 MHz; the power of the RF power source was 150 W; the upper electrode temperature was 250° C.; and the lower electrode temperature was 290° C.

For the deposition of the microcrystalline silicon film in Sample 3, a plasma CVD method was used in which plasma discharge was performed under the following condition: a source gas was introduced using a cycle flow in which the flow rate of hydrogen was 1500 sccm, that of argon was 1500 sccm, and that of silane was set to 2 sccm for 10 seconds and 0.1 sccm for 5 seconds alternately; the pressure in the treatment chamber was 10000 Pa; the RF power source frequency was 13.56 MHz; the power of the RF power source was 350 W; the upper electrode temperature was 250° C.; and the lower electrode temperature was 290° C.

For the deposition of the microcrystalline silicon film in Sample 5, a plasma CVD method was used in which plasma discharge was performed under the following condition: a source gas was introduced using a cycle flow in which the flow rate of hydrogen was 1500 sccm, that of argon was set to 1500 sccm, and that of silane was set to 2 sccm for 5 seconds and 0.1 sccm for 5 seconds alternately; the pressure in the treatment chamber was 10000 Pa; the RF power source frequency was 13.56 MHz; the power of the RF power source was 350 W; the upper electrode temperature was 250° C.; and the lower electrode temperature was 290° C.

In Sample 4 which is a reference example, a microcrystalline silicon film was formed under the second condition without using a cycle flow, unlike in Sample 3 and Sample 5. Specifically, a 300-nm-thick silicon nitride film was formed over a glass substrate, and then was subjected to plasma treatment. Next, a 5-nm-thick seed was formed under the first condition described in Embodiment 1, and then a 30-nmthick microcrystalline silicon film was formed under the second condition described in Embodiment 1 (without a cycle flow).

For the second condition without a cycle flow, a plasma CVD method was used in which plasma discharge was performed under the following condition: silane, hydrogen, and argon were introduced as a source gas at flow rates of 2 sccm, 1500 sccm, and 1500 sccm, respectively; the pressure in a treatment chamber was 10000 Pa; the RF power source frequency was 13.56 MHz; the power of the RF power source was 350 W; the upper electrode temperature was 250° C.; and the lower electrode temperature was 290° C.

Figure 15A:
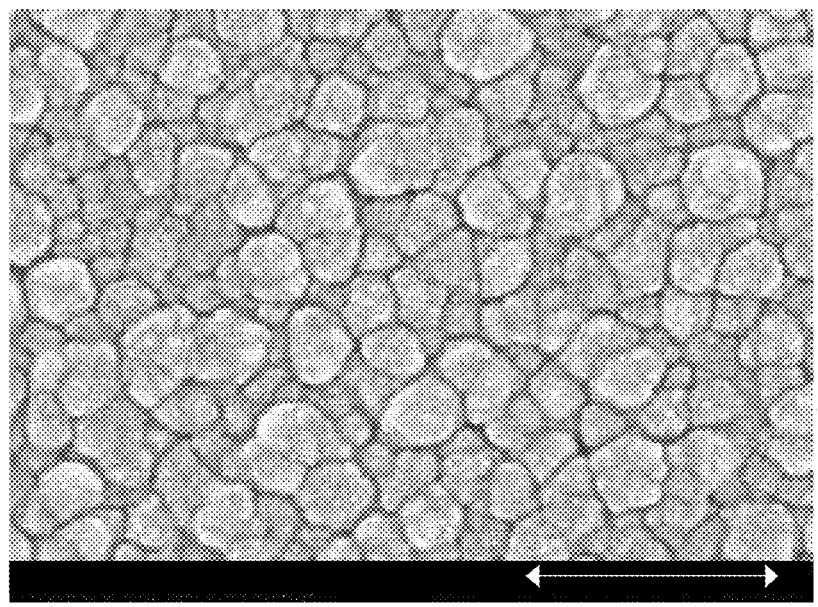
FIGS. 15A and 15B are each a SEM photograph of a microcrystalline silicon film.
Figure 15B:
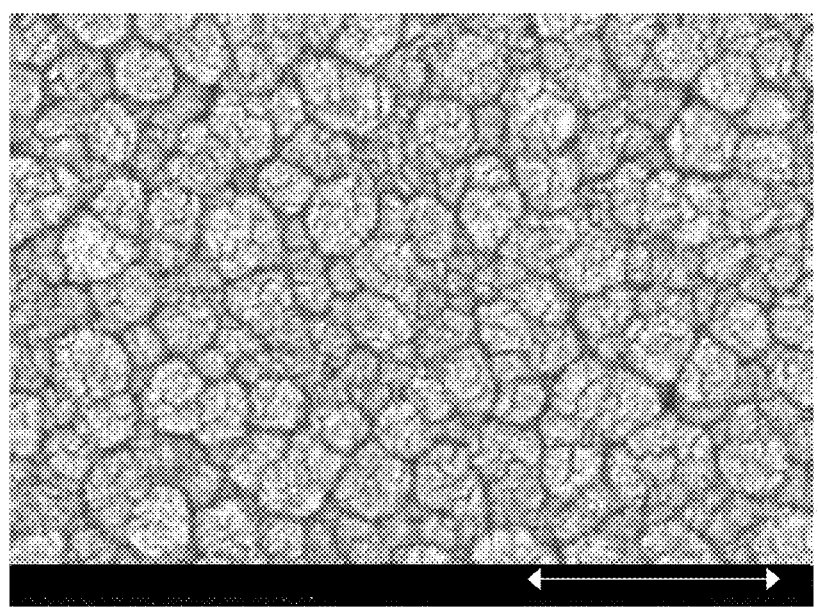

The microcrystalline silicon film in each of Sample 3 and Sample 4 was photographed with a scanning electron microscope, and the SEM photographs thereof (magnified to 0.2 million times) are shown in FIGS. 15A and 15B.

The crystallinity (Ic/Ia (the peak intensity of crystalline silicon/the peak intensity of amorphous silicon) of each of Sample 3 and Sample 4 was measured by Raman spectroscopy. The Ic/Ia of Sample 3 was 10.8, and the Ic/Ia of Sample 4 was 9.7.

Figure 17A:
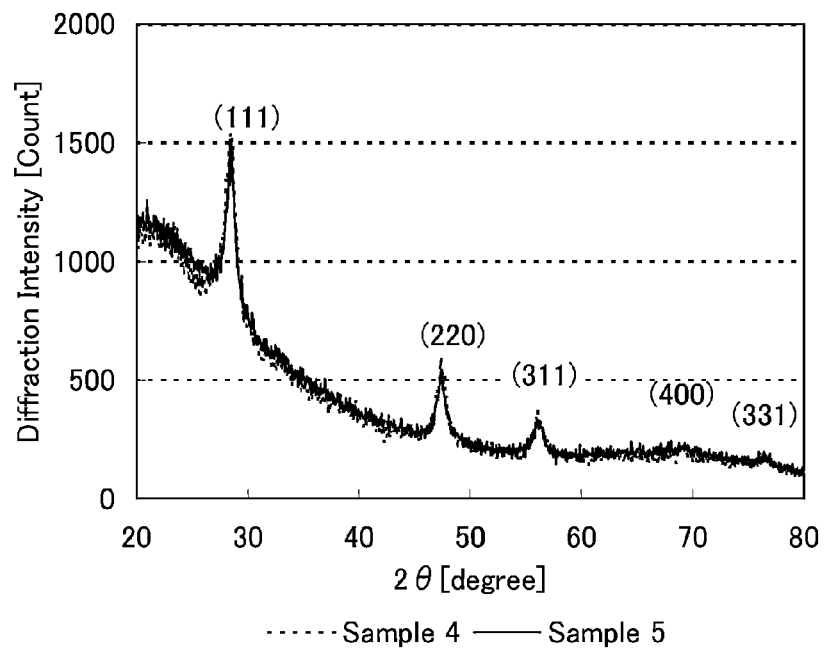
FIGS. 17A and 17B are graphs showing the X-ray diffraction intensity of a microcrystalline silicon film.
Figure 17B:
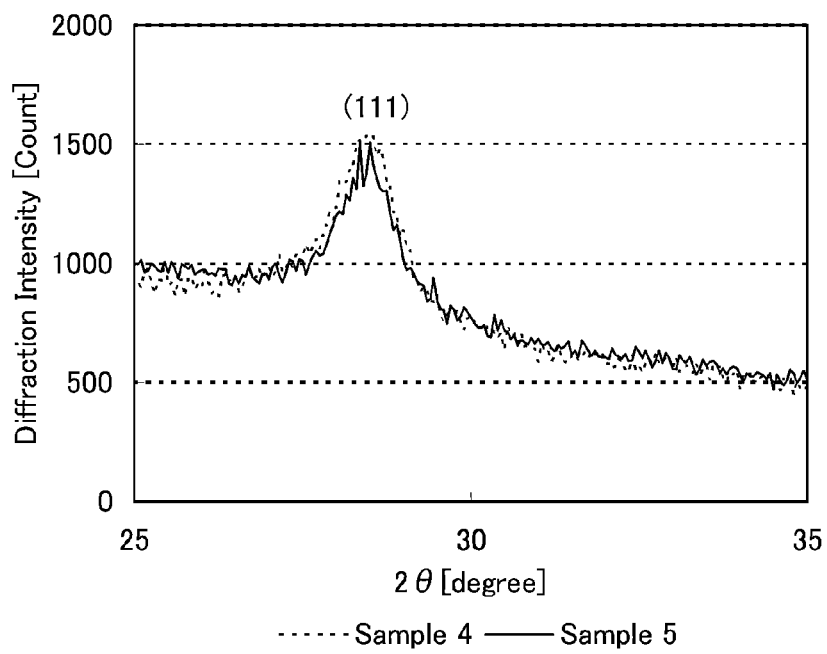

Next, the results of evaluating the sizes of the crystallites in Sample 4 and Sample 5 by an in-plane X-ray diffraction (in-plane XRD) method are shown in FIGS. 17A and 17B. FIG. 17A shows the X-ray diffraction spectrum of when $2\theta$ represented by a horizontal axis was 20 degrees to 80 degrees. FIG. 17B is an enlarged view of a peak having a plane orientation of (111) in FIG. 17A. In FIG. 17B, $2\theta$ represented by a horizontal axis was 25 degrees to 35 degrees. In FIGS. 17A and 17B, a dotted line represents the X-ray diffraction spectrum of Sample 4 which is a comparative example, and a solid line represents the X-ray diffraction spectrum of Sample 5.

Here, the full width at half maximum of the peak having a plane orientation of (111) was substituted in the Scherrer equation, and the average size of the crystallites each having a plane orientation of (111) in each sample was calculated. The average size of the crystallites each having a plane orientation of (111) in Sample 5 was 10.5 nm On the other hand, the average size of the crystallites each having a plane orientation of (111) in Sample 4 which is a comparative example was 9.2 nm.

From FIGS. 15A and 15B, it is found that when a microcrystalline silicon film is deposited after formation of a seed, a cycle flow is employed, whereby mixed phase grains can be dense and the crystallinity of the microcrystalline silicon film can be high. From FIGS. 17A and 17B, it is also found that when a microcrystalline silicon film is deposited after formation of a seed, a cycle flow is employed, whereby the size of crystallites can be large.

Example 3

In this example, electrical characteristics of a thin film transistor which is manufactured in accordance with Embodiment 3 will be described.

A method for manufacturing the thin film transistor of this example will be described with reference to FIGS. 4A to 4D and FIGS. 6A to 6C.

As illustrated in FIG. 4A, a base insulating film (not illustrated here) was formed over the substrate 101, and the gate electrode 103 was formed over the base insulating film.

Here, a glass substrate (EAGLE XG manufactured by Corning Incorporated) was used as the substrate 101.

The gate electrode 103 had a structure in which an aluminum layer was sandwiched between titanium layers. Specifically, first, a 50-nm-thick first titanium film was formed over the base insulating film by sputtering a titanium target with argon ions. At this time, the flow rate of argon which was introduced into a treatment chamber was 20 sccm, the pressure in the treatment chamber was set to 0.1 Pa, and the temperature was set to room temperature. Then, an aluminum target was sputtered with argon ions, so that a 100-nm-thick aluminum film was formed over the first titanium film. At this time, the flow rate of argon which was introduced into the treatment chamber was 50 sccm, the pressure in the treatment chamber was set to 0.4 Pa, and the temperature was set to room temperature. Furthermore, a titanium target was sputtered with argon ions, so that a 50-nm-thick second titanium film was formed over the aluminum film. At this time, the flow rate of argon which was introduced into the treatment chamber was 20 sccm and the pressure in the treatment chamber was set to 0.1 Pa. The temperature was set to room temperature.

After that, a resist was applied over the second titanium film and was irradiated with light with the use of a first photomask and developed to form a resist mask.

Next, etching was performed using the resist mask, so that the gate electrode 103 was formed. Here, two-step etching was conducted using an inductively coupled plasma (ICP) apparatus in the following manner. The first etching was performed under a condition that the ICP power was 600 W, the bias power was 250 W, boron trichloride was introduced at a flow rate of 60 sccm and chlorine was introduced at a flow rate of 20 sccm as an etching gas, and the pressure inside a treatment chamber was 1.2 Pa. After that, the second etching was performed under a condition that the ICP power was 500 W, the bias power was 50 W, the pressure was 2.0 Pa, carbon fluoride was introduced at a flow rate of 80 sccm as an etching gas, and the pressure inside the treatment chamber was 2.0 Pa. After that, the resist mask was removed.

Next, the gate insulating film 105 was formed over the gate electrode 103 and the base insulating film.

A silicon nitride film was formed as the gate insulating film 105. A 300-nm-thick silicon nitride film was formed, and then subjected to plasma treatment. Here, the deposition condition and the plasma treatment condition of the silicon nitride film in Sample 2 described in Example 1 were employed.

Next, the seed 107 was formed over the gate insulating film 105. Then, the microcrystalline semiconductor film 109 was formed as illustrated in FIG. 4B.

Here, a deposition condition similar to that of Sample 3 described in Example 2 was employed for the seed 107. The seed 107 was formed so as to have a thickness of 5 nm. A deposition condition similar to that of Sample 3 described in Example 2 was employed for the microcrystalline semiconductor film 109. The microcrystalline semiconductor film 109 was formed so as to have a thickness of 65 nm.

Next, the semiconductor film 111 was formed over the microcrystalline semiconductor film 109, and the impurity semiconductor film 113 was formed over the semiconductor film 111. The semiconductor film 111 and the impurity semiconductor film 113 were deposited by a plasma CVD method.

For the deposition of the semiconductor film 111, plasma discharge was performed under the following condition: silane, 1000 ppm ammonia (diluted with hydrogen), hydrogen, and argon were introduced as a source gas at flow rates of 20 sccm, 50 sccm, 700 sccm, and 750 sccm, respectively; the pressure in the treatment chamber was 350 Pa; the RF power source frequency was 13.56 MHz; and the power of the RF power source was 60 W. Note that here, the semiconductor film 111 was deposited using a parallel-plate plasma apparatus, with the upper electrode temperature and the lower electrode temperature set at 250° C. and 290° C., respectively.

As the impurity semiconductor film 113, a 50-nm-thick amorphous silicon film to which phosphorus was added was formed. For the deposition at this time, plasma discharge was performed under the following condition: silane, 0.5% phosphine (diluted with hydrogen), and hydrogen were introduced as a source gas at flow rates of 80 sccm, 150 sccm, and 750 sccm, respectively; the pressure in the treatment chamber was 350 Pa; the RF power source frequency was 13.56 MHz; and the power of the RF power source was 30 W. Note that here, the impurity semiconductor film was deposited using the parallel-plate plasma apparatus, with the upper electrode temperature and the lower electrode temperature set at 250° C. and 290° C. respectively.

Next, a resist was applied over the impurity semiconductor film 113 and was irradiated with light with the use of a second photomask and developed to form the resist mask 115. The process up to and including this step is illustrated in FIG. 4C.

Next, the microcrystalline semiconductor film, the semiconductor film 111, and the impurity semiconductor film 113 were etched with the use of the resist mask 115, so that the semiconductor stacked body 117 including the microcrystalline semiconductor region 117a and the amorphous semiconductor region 117b, and the impurity semiconductor film 121 were formed.

Here, the etching was performed using an ICP apparatus under the following condition: the ICP power was 450 W; the bias power was 100 W; boron chloride, carbon fluoride, and oxygen were introduced as an etching gas at flow rates of 36 sccm, 36 sccm, and 8 sccm, respectively; and the pressure in a treatment chamber was 2 Pa.

Next, oxygen plasma treatment was performed, so that an oxide film was formed on side surfaces of the impurity semiconductor film 121 and the semiconductor stacked body 117 including the microcrystalline semiconductor region 117a and the amorphous semiconductor region 117b. After that, the resist mask 115 was removed (not illustrated).

For the oxygen plasma treatment, plasma discharge was performed under the following condition: oxygen was introduced at a flow rate of 100 sccm; the pressure in the treatment chamber was 0.67 Pa; the substrate temperature was −10° C.; the source power was 2000 W; and the bias power was 350 W.

Next, as illustrated in FIG. 6A, the conductive film 127 was formed over the gate insulating film 105 so as to cover the semiconductor stacked body 117 and the impurity semiconductor film 121.

Here, the conductive film 127 had a structure in which an aluminum layer was sandwiched between titanium layers and was formed in a manner similar to that of the gate electrode 103. Note that the thicknesses of the first titanium film, the aluminum film, and the second titanium film were 50 nm, 200 nm, and 50 nm, respectively.

Next, a resist was applied over the conductive film 127 and was irradiated with light with the use of a third photomask and developed to form a resist mask. Dry etching was performed on the conductive film 127 with the use of the resist mask, so that the wirings 129a and 129b were formed.

Here, the etching was performed using an ICP apparatus under the following condition: the ICP power was 450 W; the bias power was 100 W; boron chloride and chlorine were introduced as an etching gas at flow rates of 60 sccm and 20 sccm, respectively; and the pressure in the treatment chamber was 1.9 Pa.

Then, the resist mask was removed. After that, the impurity semiconductor film 121 was subjected to dry etching, so that the pair of impurity semiconductor films 131a and 131b serving as a source region and a drain region was formed. Further, the semiconductor stacked body 117 was partly etched, so that the semiconductor stacked body 133 including the microcrystalline semiconductor region 133a and the pair of amorphous silicon regions 133b was formed.

Note that the semiconductor stacked body 117 was etched to a depth of 50 nm from its surface. In this example, the planar shape of each of the wirings 129a and 129b functioning as a source electrode and a drain electrode was linear.

Next, the surface of the semiconductor stacked body 133 was subjected to water plasma treatment, whereby impurities remaining on the surface of the semiconductor stacked body 133 were removed. Here, the water plasma treatment was performed under the following condition: the power was 1800 W; water vapor was introduced at a flow rate of 300 sccm; and the pressure in a treatment chamber was 66.5 Pa.

Next, a 300-nm-thick silicon nitride film was formed as the insulating film 137. For the deposition at this time, plasma discharge was performed under the following condition: silane, ammonia, nitrogen, and hydrogen were introduced as a source gas at flow rates of 20 sccm, 220 sccm, 450 sccm, and 450 sccm, respectively; the pressure in a treatment chamber was 160 Pa; the substrate temperature was 250° C.; the RF power source frequency was 13.56 MHz; and the power of the RF power source was 200 W.

Next, a resist was applied over the insulating film 137 and was irradiated with light with the use of a fourth photomask and developed to form a resist mask. With the use of the resist mask, part of the insulating film was subjected to dry etching so that the wirings 129a and 129b functioning as a source electrode and a drain electrode were exposed. In addition, part of the insulating film 137 and part of the gate insulating film 105 were subjected to dry etching so that the gate electrode 103 was exposed. After that, the resist mask was removed.

Next, a conductive film was formed over the insulating film 137. After that, a resist was applied over the conductive film and was irradiated with light with the use of a fifth photomask and developed to form a resist mask. With the use of the resist mask, part of the conductive film was subjected to wet etching, so that the back gate electrode 139 was formed.

In this example, as the conductive film, a 50-nm-thick indium tin oxide was deposited by a sputtering method, and was subjected to wet etching, so that the back gate electrode 139 was formed. Although not illustrated, the back gate electrode 139 was connected to the gate electrode 103. After that, the resist mask was removed.

Through the above-described process, a dual-gate thin film transistor (referred to as TFT1) was manufactured (see FIG. 6C).

In addition, the microcrystalline semiconductor film 109 was formed to a thickness of 65 nm under a condition without a cycle flow in a process similar to that of TFT1, so that a dual-gate thin film transistor (referred to as TFT2) was manufactured as a comparative example.

For the deposition of the microcrystalline semiconductor film 109 without using a cycle flow, a plasma CVD method was used in which plasma discharge was performed under the following condition: silane, hydrogen, and argon were introduced as a source gas at flow rates of 2 sccm, 1500 sccm, and 1500 sccm, respectively; the pressure in the treatment chamber was 10000 Pa; the RF power source frequency was 13.56 MHz; the power of the RF power source was 350 W; the upper electrode temperature was 250° C.; and the lower electrode temperature was 290° C.

Figure 16A:
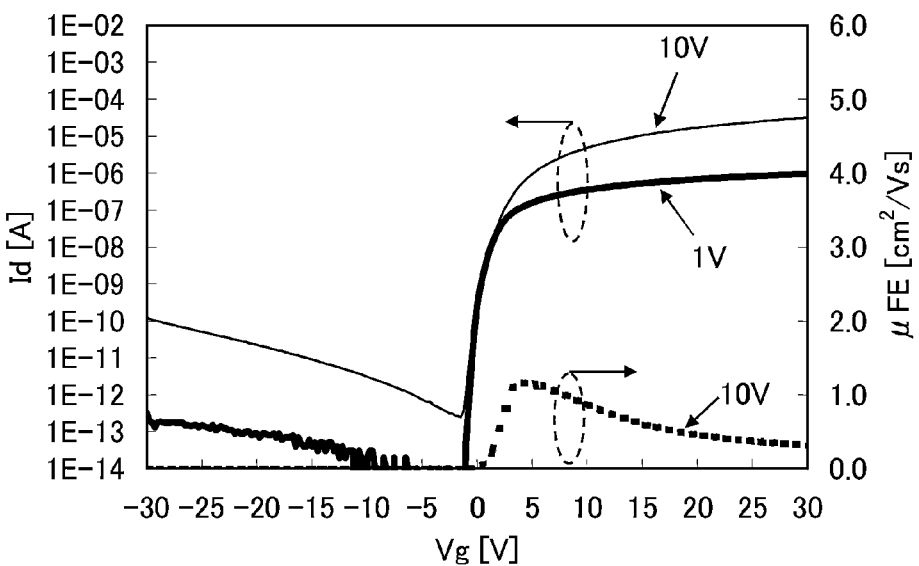
FIGS. 16A and 16B are each a graph showing the current-voltage characteristics of a thin film transistor.
Figure 16B:
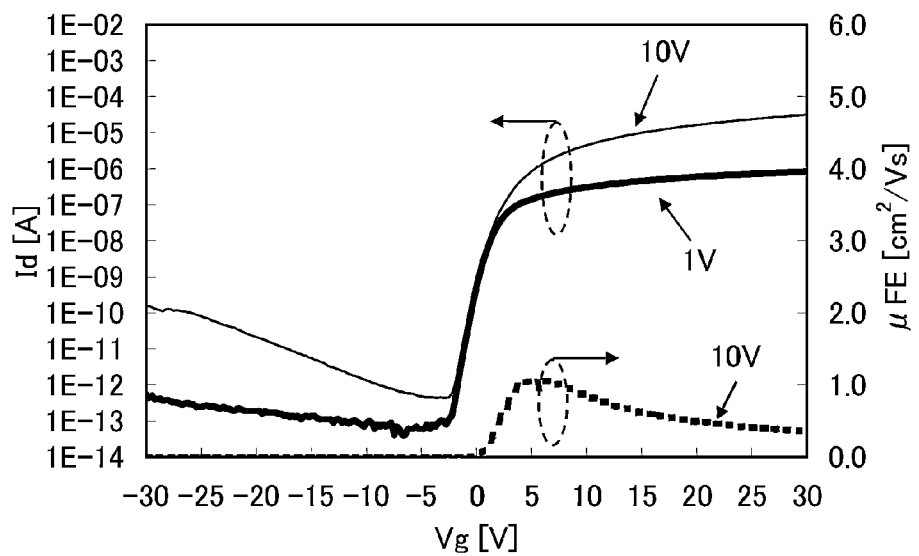

FIGS. 16A and 16B show measured electrical characteristics of the thin film transistor (TFT1) manufactured in this example and the thin film transistor (TFT2) which is a comparative example. Here, the electrical characteristics in the case where the above gate voltage was applied only to the gate electrode 103 are shown. Note that the field-effect mobility of the thin film transistor in this example was calculated under the following condition: the channel length was 3.3 μm; the channel width was 20.4 μm; the thickness of the gate insulating layer was 300 nm; and the average permittivity was 6.55.

Further, Table 1 shows the on-state current at a drain voltage of 10 V and a gate voltage of 15 V (denoted by Ion), the minimum off-state current (denoted by Ioff(min)), the off-state current at a gate voltage which is lower than the gate voltage at the minimum off-state current by 10 V (denoted by Ioff), the threshold voltage (denoted by Vth), the S value (denoted by S-value), the ratio of on-state current to minimum off-state current (denoted by Ion/Ioff_min), and the field-effect mobility at a drain voltage of 10 V (μFE_sat).

TABLE 1

|  | TFT1 | TFT2 |
| --- | --- | --- |
| Ion (Vg = 15 V) [μA] | 10.45 | 10.04 |
| Ioff (min.) [pA] | 0.25 | 0.43 |
| Ioff [pA] | 4.41 | 2.84 |
| Vth [V] | 1.33 | 1.35 |
| S-value [V/dec.] | 0.36 | 0.68 |
| Ion/Ioff (min.) [digits] | 7.62 | 7.37 |
| μFE_sat. [cm$^2$/Vs] | 1.14 | 1.04 |

From FIGS. 16A and 16B, when the microcrystalline semiconductor film was formed under the second condition, a cycle flow was performed, whereby the on-state current, a ratio of the on-state current to the minimum off-state current, and the field-effect mobility of the thin film transistor were increased, and the minimum off-state current and the S value were decreased. According to this example, a thin film transistor having high on-state current, high field-effect mobility, and low off-state current was manufactured.

This application is based on Japanese Patent Application serial no. 2010-148074 filed with Japan Patent Office on Jun. 29, 2010, the entire contents of which are hereby incorporated by reference.

What is claimed is:

1. A method for manufacturing a semiconductor device, comprising the steps of:
    forming an insulating film over a substrate;
    forming a seed over the insulating film by introducing hydrogen and a deposition gas into a first treatment chamber under a first condition: a first flow rate of hydrogen is greater than or equal to $5.0 \times 10^1$ times and less than or equal to $1.0 \times 10^3$ times a first flow rate of the deposition gas; and a first pressure in the first treatment chamber is higher than or equal to 0.5 Torr and lower than or equal to 10 Torr; and
    forming a microcrystalline semiconductor film over the seed by introducing hydrogen and the deposition gas into a second treatment chamber under a second condition: a second flow rate of the deposition gas is periodically changed between a first value and a second value; and a second pressure in the second treatment chamber is higher than or equal to 10 Torr and lower than or equal to 100 Torr,
    wherein the second value is lower than the first value, and
    wherein a flow rate ratio of the deposition gas with respect to hydrogen in the second treatment chamber is periodically changed during forming the microcrystalline semiconductor film.

2. The method according to claim 1,
    wherein a flow rate of hydrogen is a constant value under the second condition and corresponds to the first flow rate of hydrogen.

3. The method according to claim 1,
    wherein the first value is greater than or equal to $1.0 \times 10^1$ times the second value.

4. The method according to claim 1,
    wherein the first treatment chamber and the second treatment chamber are different from each other.

5. A method for manufacturing a semiconductor device, comprising the steps of:
    forming a gate electrode over a substrate;
    forming a gate insulating film over the substrate and the gate electrode;
    forming a seed over the gate insulating film by introducing hydrogen and a deposition gas into a first treatment chamber under a first condition: a first flow rate of hydrogen is greater than or equal to $5.0 \times 10^1$ times and less than or equal to $1.0 \times 10^3$ times a first flow rate of the deposition gas; and a first pressure in the first treatment chamber is higher than or equal to 0.5 Torr and lower than or equal to 10 Torr;
    forming a microcrystalline semiconductor film over the seed by introducing hydrogen and the deposition gas into a second treatment chamber under a second condition: a second flow rate of the deposition gas is periodically changed between a first value and a second value; and a second pressure in the second treatment chamber is higher than or equal to 10 Torr and lower than or equal to 100 Torr;
    forming a semiconductor film over the microcrystalline semiconductor film;
    etching part of the seed, part of the microcrystalline semiconductor film, and part of the semiconductor film to form a semiconductor stacked body; and
    forming a wiring over the semiconductor stacked body,
    wherein the second value is lower than the first value, and
    wherein a flow rate ratio of the deposition gas with respect to hydrogen in the second treatment chamber is periodically changed during forming the microcrystalline semiconductor film.

6. The method according to claim 5,
    wherein a flow rate of hydrogen is a constant value under the second condition and corresponds to the first flow rate of hydrogen.

7. The method according to claim 5,
    wherein the first value is greater than or equal to $1.0 \times 10^1$ times the second value.

8. The method according to claim 5,
    wherein the first treatment chamber and the second treatment chamber are different from each other.

9. The method according to claim 5, further comprising the step of performing plasma treatment to a side surface of the semiconductor stacked body, thereby forming a bank region on the side surface of the semiconductor stacked body.

10. The method according to claim 5, further comprising the steps of:
    forming an insulating film over the wiring, the semiconductor stacked body, and the gate insulating film; and
    forming a back gate electrode over the insulating film.

11. The method according to claim 10,
    wherein the gate electrode and the back gate electrode are electrically connected to each other.

12. The method according to claim 10, wherein the back gate electrode is in an electrically floating state.

13. A method for manufacturing a semiconductor device, comprising the steps of:
- forming an insulating film over a substrate;
- forming a seed over the insulating film by introducing hydrogen and a deposition gas into a first treatment chamber under a first condition: a first flow rate of hydrogen is greater than or equal to $5.0 \times 10^1$ times and less than or equal to $1.0 \times 10^3$ times a first flow rate of the deposition gas; and a first pressure in the first treatment chamber is higher than or equal to 0.5 Torr and lower than or equal to 10 Torr; and
- forming a microcrystalline semiconductor film over the seed by introducing hydrogen and the deposition gas into a second treatment chamber under a second condition: a second pressure in the second treatment chamber is higher than or equal to 10 Torr and lower than or equal to 100 Torr,
- wherein a flow rate ratio of the deposition gas with respect to hydrogen in the second treatment chamber is periodically changed during forming the microcrystalline semiconductor film.

14. The method according to claim 13,
wherein a flow rate of hydrogen is periodically changed between a first value and a second value in the second treatment chamber during forming the microcrystalline semiconductor film.

15. The method according to claim 14,
wherein the first value is greater than or equal to $1.0 \times 10^1$ times the second value.

16. The method according to claim 13,
wherein the first treatment chamber and the second treatment chamber are different from each other.

17. A method for manufacturing a semiconductor device, comprising the steps of:
- forming a gate electrode over a substrate;
- forming a gate insulating film over the substrate and the gate electrode;
- forming a seed over the gate insulating film by introducing hydrogen and a deposition gas into a first treatment chamber under a first condition: a first flow rate of hydrogen is greater than or equal to $5.0 \times 10^1$ times and less than or equal to $1.0 \times 10^3$ times a first flow rate of the deposition gas; and a first pressure in the first treatment chamber is higher than or equal to 0.5 Torr and lower than or equal to 10 Torr;
- forming a microcrystalline semiconductor film over the seed by introducing hydrogen and the deposition gas into a second treatment chamber under a second condition: a second pressure in the second treatment chamber is higher than or equal to 10 Torr and lower than or equal to 100 Torr;
- forming a semiconductor film over the microcrystalline semiconductor film;
- etching part of the seed, part of the microcrystalline semiconductor film, and part of the semiconductor film to form a semiconductor stacked body; and
- forming a wiring over the semiconductor stacked body,
- wherein a flow rate ratio of the deposition gas with respect to hydrogen in the second treatment chamber is periodically changed during forming the microcrystalline semiconductor film.

18. The method according to claim 17,
wherein a flow rate of hydrogen is periodically changed between a first value and a second value in the second treatment chamber during forming the microcrystalline semiconductor film.

19. The method according to claim 18,
wherein the first value is greater than or equal to $1.0 \times 10^1$ times the second value.

20. The method according to claim 17,
wherein the first treatment chamber and the second treatment chamber are different from each other.

21. The method according to claim 17, further comprising the step of exposing a side surface of the semiconductor stacked body to plasma, thereby forming a bank region on the side surface of the semiconductor stacked body.

22. The method according to claim 17, further comprising the steps of:
- forming an insulating film over the wiring, the semiconductor stacked body, and the gate insulating film; and
- forming a back gate electrode over the insulating film.

23. The method according to claim 22,
wherein the gate electrode and the back gate electrode are electrically connected to each other.

24. The method according to claim 22, wherein the back gate electrode is in an electrically floating state.

25. The method according to claim 1, wherein the second value is greater than zero.

26. The method according to claim 5, wherein the second value is greater than zero.

* * * * *